United States Patent [19]
Yoshida

[11] Patent Number: 5,381,380
[45] Date of Patent: Jan. 10, 1995

[54] DIVIDE CIRCUIT HAVING HIGH-SPEED OPERATING CAPABILITY

[75] Inventor: Yukihiro Yoshida, Ikoma, Japan

[73] Assignee: Sharp Kabushiki Kaisha, Osaka, Japan

[21] Appl. No.: 57,973

[22] Filed: May 7, 1993

[30]     Foreign Application Priority Data

May 18, 1992 [JP]  Japan .................... 4-125069

[51] Int. Cl.⁶ ............................................. G06F 7/52
[52] U.S. Cl. ................................................... 364/767
[58] Field of Search ................ 364/767, 766, 746.2

[56]     References Cited

U.S. PATENT DOCUMENTS

| | | | |
|---|---|---|---|
| 4,722,069 | 1/1988 | Ikeda | 364/767 |
| 4,939,686 | 7/1990 | Fandrianto | 364/767 |
| 5,177,703 | 1/1993 | Mori | 364/767 |
| 5,258,944 | 11/1993 | Smith | 364/767 |

*Primary Examiner*—David H. Malzahn

[57]     ABSTRACT

A divide circuit which is adapted to obtain a quotient by using a dividend and a divisor, the dividend and the divisor being input signals of either quadruple logic or quadruple logic converted from binary logic, includes a unit for setting a candidate value of the quotient, a unit connected to the setting unit for multiplying the quotient candidate value by the divisor, and a unit connected to the multiplying unit for comparing a result obtained by the multiplying unit with the dividend.

19 Claims, 28 Drawing Sheets

Fig. 2

| ADDRESS JUDGEMENT | INSTRUCTION | NEXT ADDRESS |
|---|---|---|
| $A_1$ | $X \to W$, $n \to i$ | $A_2$ |
| $A_2$ | $S > W$, $S = W$, $S < W$ | |
|   $J_1$ | | $A_3$ |
|   $J_2$ | | $A_3$ |
|   $J_3$ | SHIFT X TO RIGHT | $A_3$ |
| $A_3$ | $1 \to Y_{2i}$, $1 \to Y_{2i-1}$ | $A_4$ |
| $A_4$ | $XY \to W$ | $A_5$ |
| $A_5$ | $S > W$, $S = W$, $S < W$ | |
|   $J_1$ | | $A_{10}$ |
|   $J_2$ | | $A_{10}$ |
|   $J_3$ | $1 \to Y_{2i}$, $0 \to Y_{2i-1}$ | $A_6$ |
| $A_6$ | $XY \to W$ | $A_7$ |
| $A_7$ | $S > W$, $S = W$, $S < W$ | |
|   $J_1$ | | $A_{10}$ |
|   $J_2$ | | $A_{10}$ |
|   $J_3$ | $0 \to Y_{2i}$, $1 \to Y_{2i-1}$ | $A_8$ |
| $A_8$ | $XY \to W$ | $A_9$ |
| $A_9$ | $S > W$, $S = W$, $S < W$ | |
|   $J_1$ | | $A_{10}$ |
|   $J_2$ | | $A_{10}$ |
|   $J_3$ | $0 \to Y_{2i}$, $0 \to Y_{2i-1}$ | $A_{10}$ |
| $A_{10}$ | $i = 1$ | |
|   $\overline{J_4}$ | $i - 1 \to i$ | $A_3$ |
|   $J_4$ | | $A_0$ |

Fig. 4

| ADDRESS | JUDGEMENT | INSTRUCTION | NEXT ADDRESS |
|---|---|---|---|
| $A_1$ | | $X \to W$, $n \to i$ | $A_2$ |
| $A_2$ | | $S > W$, $S = W$, $S < W$ | |
| | $J_1$ | | $A_3$ |
| | $J_2$ | | $A_3$ |
| | $J_3$ | SHIFT X TO RIGHT | $A_3$ |
| $A_3$ | | $1 \to Y_{2i}$, $1 \to Y_{2i-1}$ | $A_4$ |
| $A_4$ | | $XY \to W$ | $A_5$ |
| $A_5$ | | $S > W$, $S = W$, $S < W$ | |
| | $J_1$ | | $A_{10}$ |
| | $J_2$ | | $A_0$ |
| | $J_3$ | $1 \to Y_{2i}$, $0 \to Y_{2i-1}$ | $A_6$ |
| $A_6$ | | $XY \to W$ | $A_7$ |
| $A_7$ | | $S > W$, $S = W$, $S < W$ | |
| | $J_1$ | | $A_{10}$ |
| | $J_2$ | | $A_0$ |
| | $J_3$ | $0 \to Y_{2i}$, $1 \to Y_{2i-1}$ | $A_8$ |
| $A_8$ | | $XY \to W$ | $A_9$ |
| $A_9$ | | $S > W$, $S = W$, $S < W$ | |
| | $J_1$ | | $A_{10}$ |
| | $J_2$ | | $A_0$ |
| | $J_3$ | $0 \to Y_{2i}$, $0 \to Y_{2i-1}$ | $A_{10}$ |
| $A_{10}$ | | $i = 1$ | |
| | $\overline{J_4}$ | $i - 1 \to i$ | $A_3$ |
| | $J_4$ | | $A_0$ |

$S_i > W_i, S_i = W_i, S_i < W_i$ ( $i = 1, 2, 3, \cdots n$ )

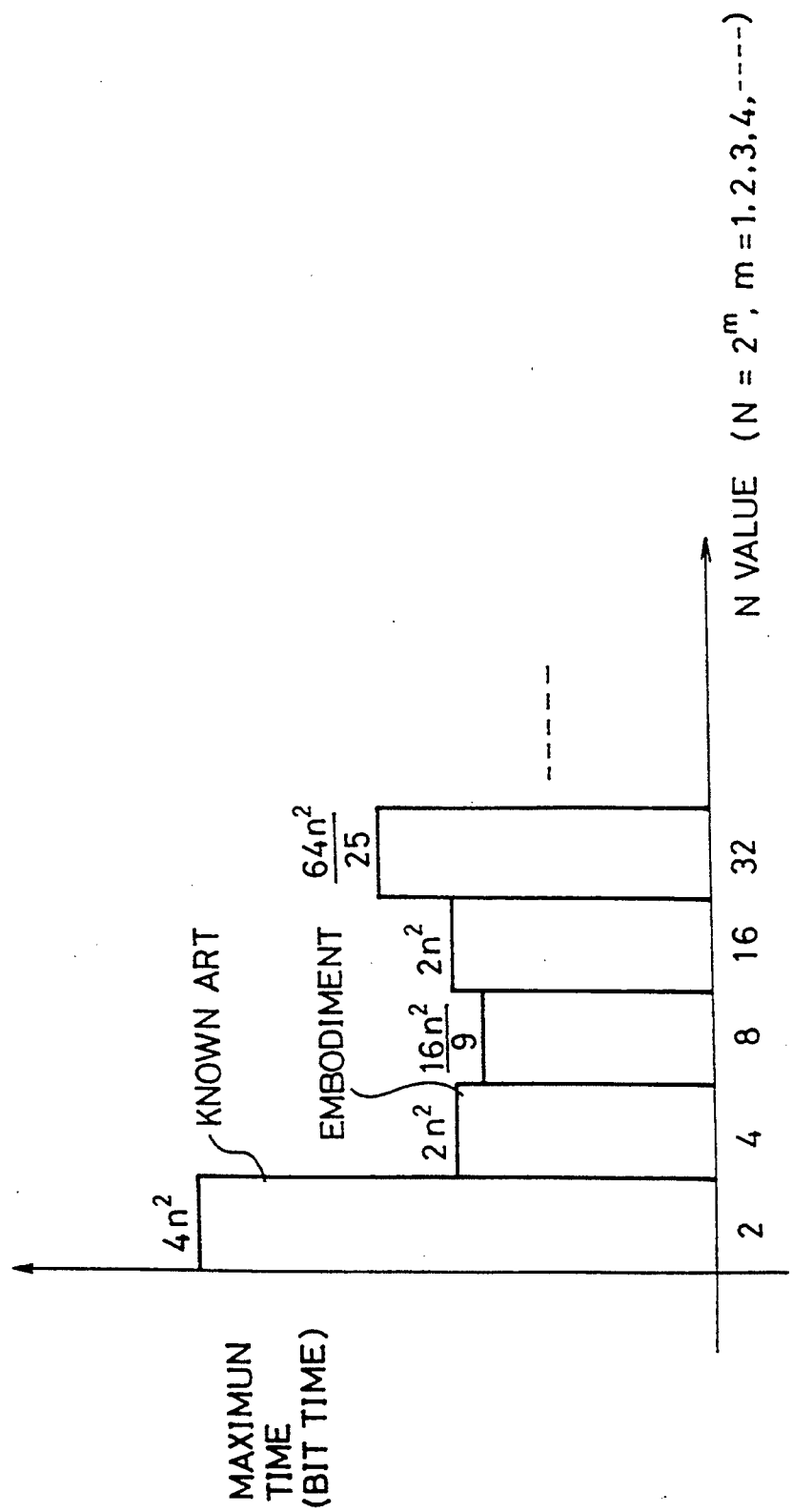

DIVIDE CIRCUIT HAVING HIGH-SPEED OPERATING CAPABILITY

BACKGROUND OF THE INVENTION

1. Field of the Invention

The present invention relates to a divide circuit, and more particularly to a divide circuit which may be used in various types of operating circuits such as a numeral operating circuit for a personal computer or a workstation or a built-in numeral operating circuit for a digital signal processor or a microprocessor.

2. Description of the Related Art

In the field of digital information computer processing processing speeds have become faster and faster. Accordingly, the speed of performing a dividing operation must be far faster, because numerous divisions are executed in numerical calculations.

The inventors of the present application know that in one conventional method, in order to obtain a quotient, subtractions are iteratively performed with respect to a dividend and a divisor. In another conventional method, multiplications may be iteratively performed. However, both of these methods do not allow for increasing the quotient calculating speed; that is, it is quite difficult to execute information processing at high speed.

SUMMARY OF THE INVENTION

It is an object of the present invention to provide a divide circuit which achieves fast operation and to which both a binary signal may be applied and a quadruple signal.

The object of the present invention is achieved by a divide circuit which obtains a quotient by using a dividend and a divisor, the dividend and the divisor being input signals of either quadruple logic or quadruple logic converted from binary logic. The divide circuit includes a unit for setting a candidate value of the quotient, a unit connected to the setting unit for multiplying the quotient candidate value by the divisor, and a unit connected to the multiplying unit for comparing a result obtained by the multiplying unit with the dividend.

The comparing unit is adapted to execute a comparison of the dividend with the multiplied result in sequence from the most significant digits to the lower digits and to determine which of the dividend and the multiplied value is larger according to an initial determined result indicating which of the dividend and the multiplied result is larger.

The comparing unit includes an equivalent circuit for receiving the dividend and the multiplied result, and for outputting equivalent values corresponding to the received dividend and the received multiplied result, respectively.

The comparing unit further includes an AND circuit, connected to the equivalent circuit, for executing AND logic between the equivalent value corresponding to the dividend and the equivalent values corresponding to the multiplied result output from the equivalent circuit, and for outputting a result the AND logic.

The comparing unit further includes an OR circuit, connected to the AND circuit, for executing OR logic between outputs from the AND circuit, and for outputting any one of the results of the AND circuit according to the initial determined result.

The comparing unit further includes a circuit for determining whether or not the equivalent value of the dividend is larger than the equivalent value of the multiplied result, and for outputting a results of the determination as one of the result of the AND circuit.

The comparing unit further includes a circuit for determining whether or not the equivalent value of the dividend is equal to the equivalent value of the multiplied result, and for outputting a results of the determination as one of the result of the AND circuit.

The comparing unit further includes a circuit for determining whether or not the equivalent value of the dividend is less than the equivalent value of the multiplied result, and for outputting a results of the determination as one of the result of the AND circuit.

The divide circuit further includes a circuit for converting a binary, signal into a quadruple signal so that the comparing unit can be used with quadruple logic.

The divide circuit further includes a circuit for converting a binary signal into another form of a binary signal so that the comparing unit can be used with other forms of binary logic.

The divide circuit is arranged so that the compared result of each digit of a division is determined after n bit time at maximum and is input to the circuit for determining whether or not the equivalent value of the dividend is larger than the equivalent value of the multiplied result, and at a time when a search signal is supplied to the compared result in sequence from the most significant digit, and it is determined whether not the equivalent value of the dividend is larger than the equivalent value of the multiplied result, and then it is determined whether or not the equivalent value of the dividend is equal to the equivalent value of multiplied the result.

The multiplying unit is adapted to execute a multiplication in response to any one of a quadruple signal and a binary signal.

The multiplying unit includes an equivalent circuit for receiving a divisor and a quotient candidate value, and for outputting equivalent values of the divisor and the quotient candidate value, respectively.

The multiplying unit further includes an AND circuit connected to the equivalent circuit for executing AND logic of the equivalent values of the divisor and the quotient candidate value output from the equivalent circuit, and for outputting a result of the AND logic.

The multiplying unit further includes an OR circuit connected to the AND circuit for executing OR logic on the result of the AND circuit output from the AND circuit, and for outputting a result of the OR logic.

The multiplying unit further includes a logic circuit connected to the OR circuit for executing AND logic of the result of the OR circuit output from the OR circuit and a carry input, for executing OR logic on the result of the AND logic, and for outputting a result of the OR logic.

The multiplying unit further includes a delaying circuit connected to the logic circuit for delaying the result of the OR logic output from the logic circuit.

In operation, an operation is executed to temporarily assume a quotient candidate value and obtain a multiplier to be multiplied with a divisor. The multiplier is compared with the dividend. According to the compared result, the quotient candidate value is sequentially increased or decreased in search of a proper candidate value which is equal to the dividend.

The comparing unit operates to sequentially compare the multiplier with the dividend on each digit of the quotient in sequence From the most significant digits. When both of the values are not equal to each other, it is determined which of the dividend and the candidate value is larger.

The object of the present invention can be achieved by a divide method used in a divide circuit for obtaining a quotient using a dividend and a divisor and for obtaining a quotient by executing an operation n times at maximum. The divide circuit has a plurality of circuits, each of the plurality of circuits composed of an AND logic element, an OR logic element and a register, the divide circuit further having a 2n-bit S register for storing a dividend S, an X register for storing a divisor X, a Y register for storing a quotient candidate value Y, a W register for storing a multiplied result W of a divisor X times a quotient candidate value Y, wherein the dividend S and the quotient candidate value Y of each digit of the quotient are stored in corresponding registers in sequence from the most significant digits. The divide method includes the steps of determining whether or not the divisor X is 0, determining whether or not an error takes place, the error having occurred when the divisor X is determined as 0, determining whether or not $S \geq X$ setting a value of 3 as a candidate of a quotient to most significant digits of registers $Y_{2i}$ and $Y_{2i-1}$ if $S \geq W$, shifting a value of the divisor X to the right by one digit so that the right shift is executed and a value of 3 is set to the Y register if $S<W$, multiplying the divisor X with the quotient candidate value Y, comparing the multiplied result W and the dividend S with each other, determining the value of 3 as most significant digit of the quotient if $S \geq W$, obtaining a next digit, setting a value of 2 as a quotient candidate in the Y register if $S<W$, determining whether or not the most significant digit of the quotient is 2, setting the value of 2 as the most significant digit of the quotient if $S \geq W$, obtaining a next digit, determining whether or not the most significant digit of the quotient is 1 if $S<W$, obtaining a next digit in case that the most significant digit of the quotient is 1, determining the most significant digit of the quotient is zero in case that the most significant digit of the quotient is not 1, and obtaining a next digit.

The step of comparing the dividend S and the multiplied value W of the divisor X and the quotient candidate Y is subdivided into steps of executing a verification whether $S=W$, and executing a comparsion of $S>W$ in the comparison of $S \geq W$ for all quotient candidates 3 through 1 as well.

The step is subdivided in such a manner that if $S=W$, all quotient candidates for non-operative digits are made 0 and the quotient Y of all digits is determined with operated quotient candidates and the operation is terminated at this instance, thereby the dividend S is exactly divided by the divisor X.

The step is subdivided in such a manner that if $S \neq W$ the quotient will be obtained to the Y register by executing the operation n times at maximum, a condition of $S \neq W$ is adapted and then is terminated, thereby a resulting quotient is an approximation with a remainder.

As described above, the divide circuit according to the invention is arranged to assume a quotient candidate value and select a quotient with the comparing unit. Since a simple comparing unit is used for obtaining a quotient, the fast processing is made possible, The comparing unit may determine which of both values is larger on the higher digit. In this case, it is not necessary to execute the determination on the lower digits, which leads to saving the operating time. Further, the divide circuit may apply to both a binary signal and a quadruple signal.

Further objects and advantages of the present invention will be apparent from the following description of the preferred embodiments of the invention as illustrated in the accompanying drawings.

BRIEF DESCRIPTION OF THE DRAWINGS

FIG. 2 is a view showing a program for executing the flowchart shown in FIG. 1;

FIG. 4 is a view showing a program for executing the flowchart shown in FIG. 3;

FIG. 33 is a graph showing the relation between a bit time and the dividing speed expanded with respect to an N value.

DESCRIPTION OF THE PREFERRED EMBODIMENTS

Figure 1:
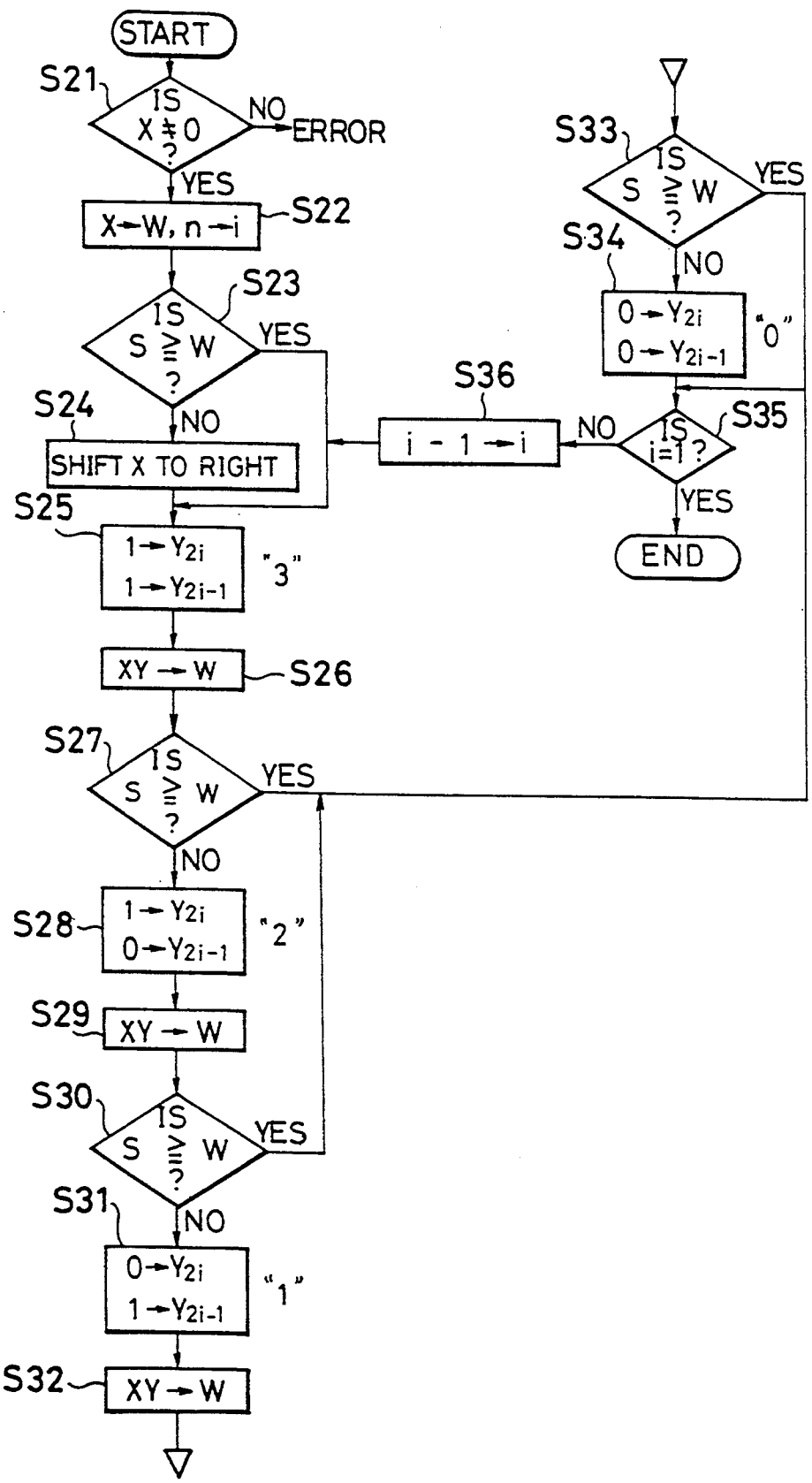
FIG. 1 is a flowchart for illustrating operation of a divide circuit according to the present invention.

Referring to the accompanying drawings, a preferred embodiment of the divide circuit according to the present invention will be described in detail.

At first, an operating method used in a divide circuit according to the invention will be described as referring to the flowchart of FIG. 1.

A dividend S is stored in a 2n-bit S register and a divisor X is stored in an X register. A quotient candidate value Y is stored in a Y register. The multiplied result $X \times Y$ is stored in a W register. Before starting the division, the dividend S and the quotient candidate value Y on each digit of the quotient are stored in the corresponding registers in sequence from the most significant digits.

At a step S21, it is determined whether or not the divisor X is "0". At present, the divisor X is assumed to be not "0". If the divisor X is "0", then it is determined that an error takes place.

As mentioned above, the dividend S and the divisor X are stored in their corresponding registers S and X.

In order to determine whether the dividend S is larger than or equal to the divisor X, the content of the X register is transferred to the W register and a value of i is set to n according to an instruction at a step S22.

At a step S23, an operation is executed to make sure which of S and W is larger. If $S \geq W$, that is, a value of "3" as a candidate of the quotient S is set to the most significant digits of the registers $Y_{2i}$ and $Y_{2i-1}$, at a step S25.

If $S < W$, it is necessary to shift a value of X to the right one digit, so that the right shift is executed at a step S24, and then, a value of "3" is set to the Y register.

Next, at a step S26, X is multiplied by Y.

At a step S27, the multiplied result W and the dividend S are compared with each other. If $S \geq W$, the value of "3" is determined as the most significant digit of the quotient, and then, the operation passes through steps S35 and S36 (to be described later) to the next stage for starting to obtain a new quotient.

If $S < W$ at the step S27, then at a step S28, a value of "2" is set as a quotient candidate in the Y register, and it is determined whether or not the most significant digit of the quotient is "2" through steps S28 to S30.

If $S \geq W$ at a step S30, the most significant digit of the quotient is "2", and like the above, the operation goes to the step S35 at which the next digit is obtained.

If $S < W$, it is determined whether or not the most significant digit of the quotient is "1" at the steps S31 through S33. In case that the most significant digit of the quotient is "1", then the operation goes to a step S35 at which the next digit is obtained. On the other hand, in case that the most significant digit of the quotient is not "1", at a step S34, the most significant digit of the quotient is determined as zero, and then, the operation goes to the step S35 at which the next digit is obtained.

By executing the above operation n times at maximum, a quotient in the Y register is obtained finally.

FIG. 2 shows a program for executing the above mentioned operating method.

In FIG. 2, $A_0$ represents an initial address and $A_1$, $A_2$, $A_3$, ..., $A_{10}$ represent execution addresses used for obtaining a quotient.

Figure 3:
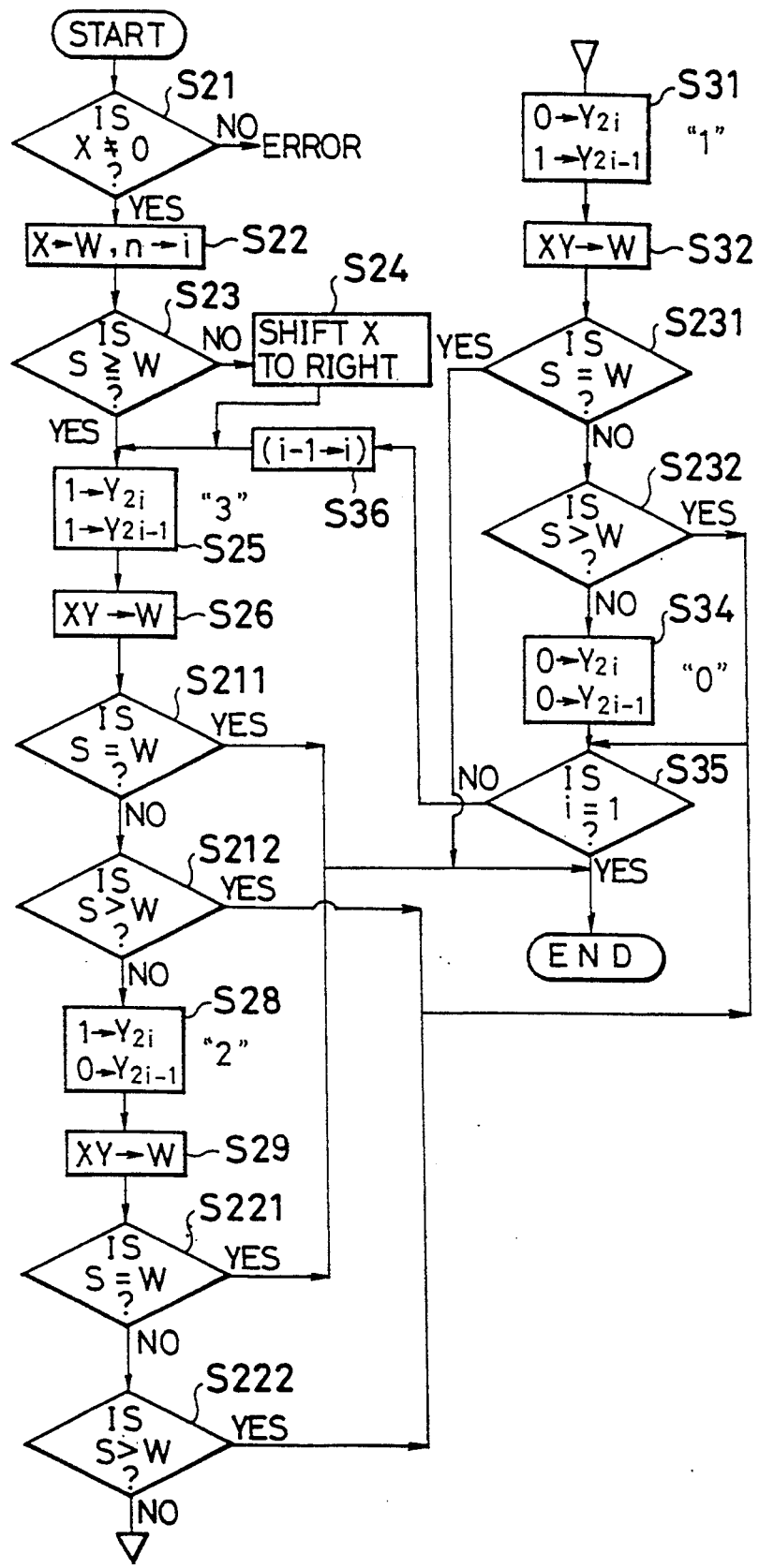
FIG. 3 is a flowchart for illustrating operation of a divide circuit according to the present invention.

FIG. 3 shows another embodiment of the divide circuit according to the present invention in which the comparison of the dividend S and the multiplied value W of the divisor X and the quotient candidate Y at FIG. 1 is subdivided.

For example, the comparison $S \geq W$ at the step S27, in case of the quotient candidate of "3" in FIG. 1, is subdivided into the verification process $S = W$ at the step S211 and the comparing process $S > W$ at a step S212 in FIG. 3. This holds true for the quotient candidates "2" and "1" as well.

The steps in FIG. 3 having the same operation as the steps in FIG. 1 are represented with the same reference numerals.

The different aspects of FIG. 3 from FIG. 1, which result from the subdivision, are as follows. If the condition $S = W$ is met, all the quotient candidates for the non-operative digits are made "0", and the quotient Y of all digits is determined with the operated quotient candidates, the operation is terminated at this instance.

On the other hand, if the condition $S = W$ is not met, the quotient will be obtained in the Y register by executing the operation n times at maximum.

If the operation is terminated in the condition of $S = W$, the dividend S is exactly divided by the divisor X. If the operation is executed n times in the condition of $S \neq W$ (S is not equal to W) and then is terminated, it indicates that the resulting quotient is an approximation with a remainder.

An example of a program used for executing the divide method of FIG. 3 is shown in FIG. 4.

In FIG. 4, $A_0$ represents an initial address and $A_1$, $A_2$, ..., $A_{10}$ represent execution addresses as shown in FIG. 2.

In this embodiment, each digit candidate of the quotient is obtained in sequence from a larger digit to a smaller digit, as "3", "2", "1" and "0" in sequence, for obtaining a quotient.

As another embodiment, each digit candidate of the quotient may be obtained in sequence from a smaller digit to a larger digit, as "0", "1", "2" and "3" in sequence. This embodiment is similar to the previous embodiment.

Next, the division containing a decimal point is treated as follows. The decimal point method may be divided into a floating point method and a fixed point method.

Hereinafter, as an example, the floating point method is described.

It is assumed that a mantissa S of the dividend is stored at the most significant digit of the S register and a mantissa X of the divisor is stored at the most significant digit of the X register. Exponent parts of the dividend and the divisor are denoted by p and x, respectively. In this case, the mantissa Y of the quotient is stored in the Y register and is obtained in sequence from the most significant digit of the quotient according to the above described flowchart process. For executing the division, the following operation is carried out. That is, $$S/X = Y \cdot 4^{p-x} \quad (1)$$

where a sign bit of S is $S_s$, a sign bit of X is $X_s$, sign bits of p and x are $p_s$ and $x_s$, an exponent part of a quotient is y, a sign bit of y is $y_s$. Then, the sign $Y_s$ of the mantissa of the quotient is:

$$Y_s = S_s + X_s \quad (2)$$

The exponent parts are as shown in the chart 1, with $p \geq 0$, $x \geq 0$,

Chart 1

| $p_s$ | $x_s$ | y | | | $y_s$ | | | | | |
|---|---|---|---|---|---|---|---|---|---|---|
| 0 | 0 | p − x | p > x | 0 | p = x | 0 | p < x | 1 |
| 0 | 1 | p + x | — | 0 | — | 0 | — | 0 |
| 1 | 0 | −(p + x) | — | 1 | — | 1 | — | 1 |
| 1 | 1 | −(p − x) | p > x | 1 | p = x | 0 | p < x | 0 |

Figure 5:
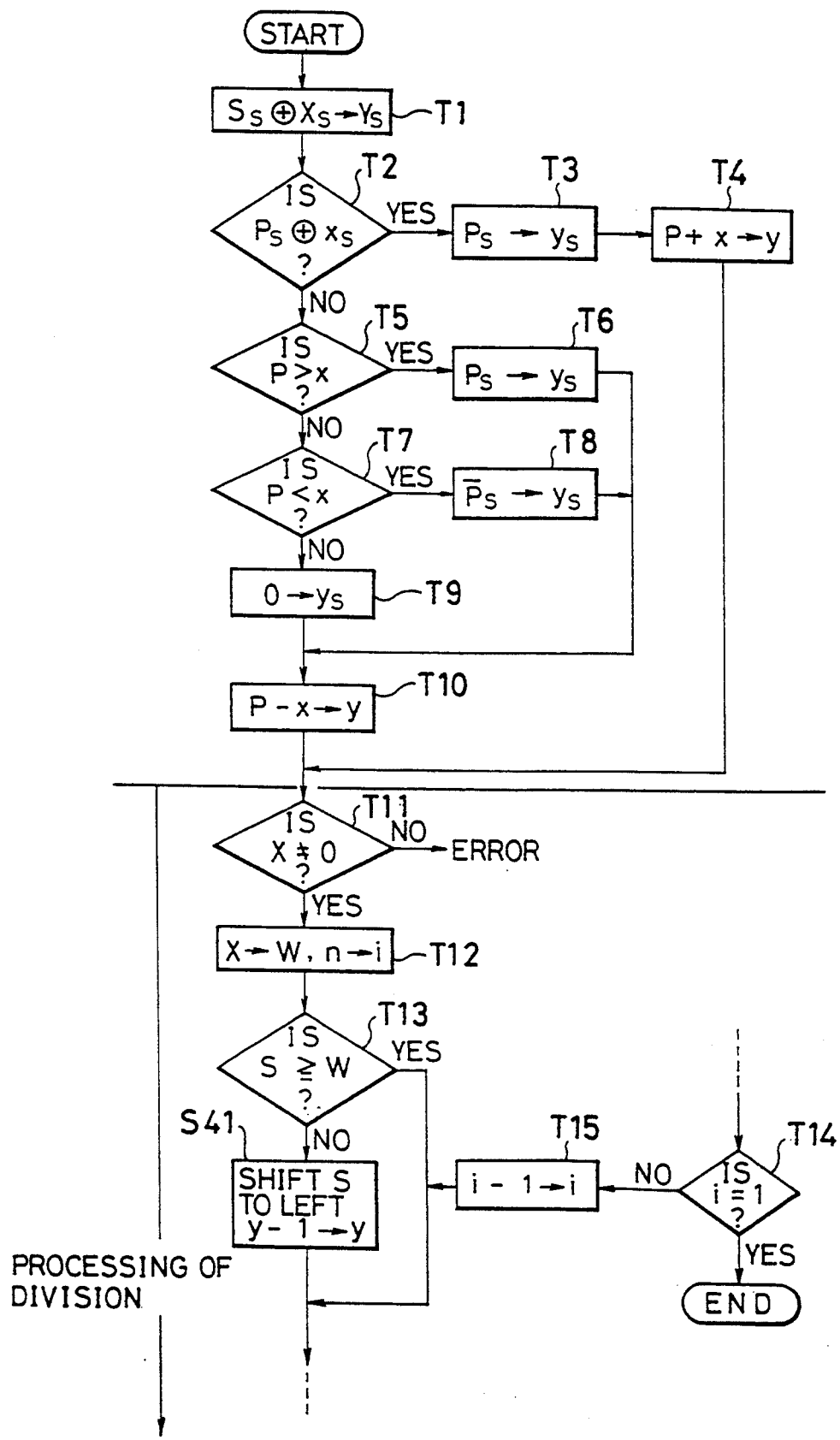
FIG. 5 is a flowchart showing operation of a mantissa and an exponent part in the division.
Figure 6:
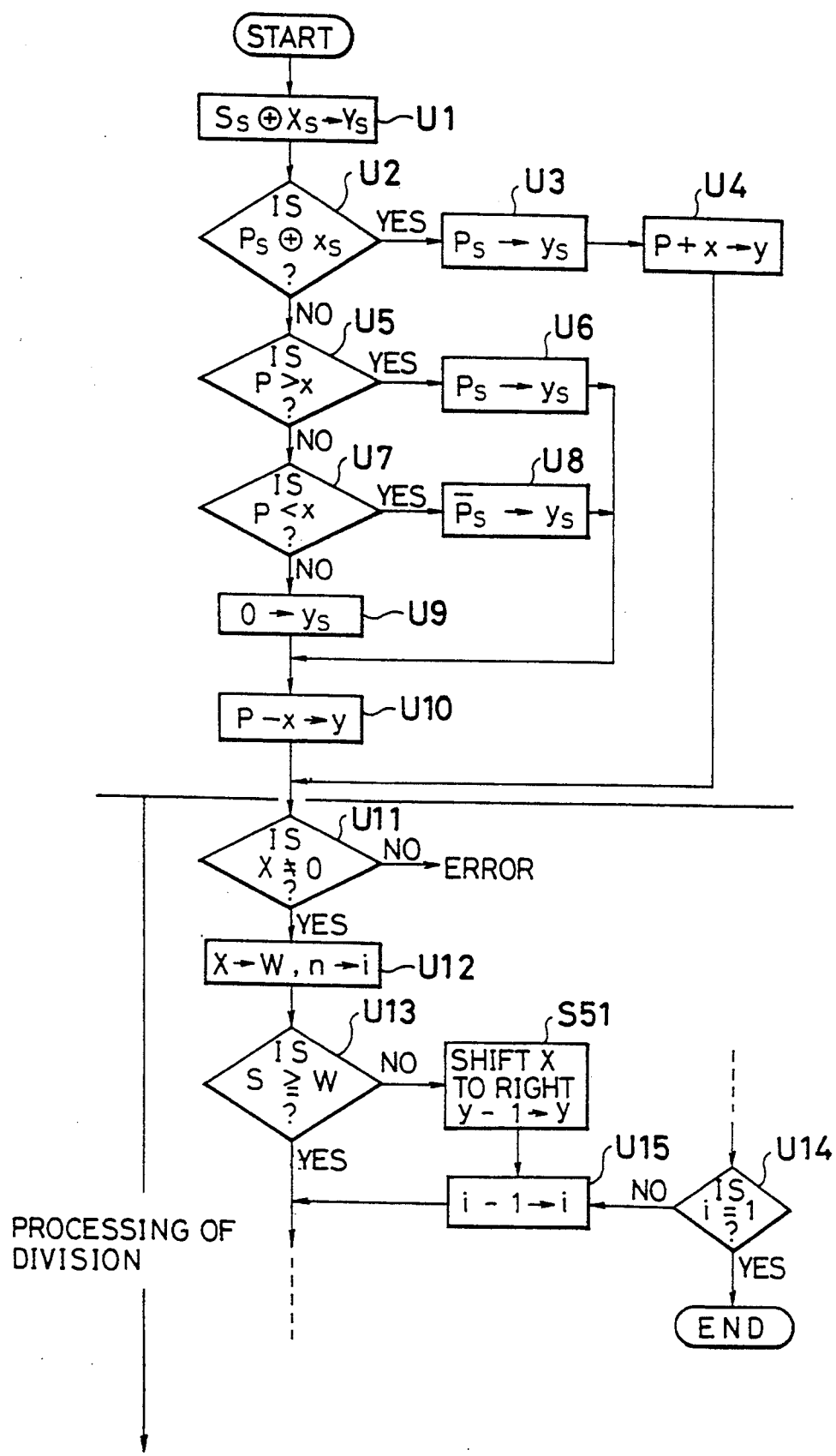
FIG. 6 is a flowchart showing operation of a mantissa and an exponent part in the division.

The chart 1 may be represented as either one of flowcharts represented in FIGS. 5 or 6.

The flowchart of FIG. 5 illustrates a situation in which the content of the S register is shifted to the left hand side and the operation of y−1→y is executed simultaneously at a step 41 if the mantissa S of the dividend is smaller than the mantissa X of an operator, and the quotient is obtained on each digit in sequence from the most significant digit in the Y register.

The flowchart of FIG. 6 illustrates a situation in which the content of X is shifted to the right hand side and the operation of y−1→y is executed at a step 51 and the quotient is obtained on each digit in sequence from the digit next to the most significant digit in the Y register if S<X is met.

The circuits for executing the flowcharts and each process may be arranged by well known techniques, hence those circuits are not described herein. This description holds true for the fixed point system as well.

The foregoing divide method compares a multiplied value of the quotient candidate and the divisor on each quotient digit with the dividend for obtaining a quotient, thereby the divide method offers a quite faster operating speed than known divide methods.

The divide circuit of the present invention for executing the above described division may commonly apply to a binary signal and a quadruple signal or a combination of both signals.

The use of the quadruple logic makes it possible to reduce the number of input/output (I/O) signals by two in comparison with the use of the binary logic. This is effective for the multiplier disclosed in Japanese Patent Application laying Open (KOKAI) No. H5-158659 as well as a multiplying circuit and a comparator to be described later. This is quite effective for reducing the internal wiring in case that the divide circuit is formed in a Large Scale Integrated circuit (LSI).

Next, a multiplier used for executing a multiplication at steps S26 and S29 of the flowchart will be described.

The logic of the multiplier may be represented by the following charts.

Chart 2

| | $C_0$ | | | | $C_{1/3}$ | | | | $C_{2/3}$ | | | |
|---|---|---|---|---|---|---|---|---|---|---|---|---|
| | $X_0$ | $X_{1/3}$ | $X_{2/3}$ | $X_1$ | $X_0$ | $X_{1/3}$ | $X_{2/3}$ | $X_1$ | $X_0$ | $X_{1/3}$ | $X_{2/3}$ | $X_1$ |
| $Y_0$ | | | | | | 1 | 1 | 1 | 1 | 2 | 2 | 2 | 2 |
| $Y_{1/3}$ | | 1 | 2 | 3 | | 1 | 2 | 3 | | | 2 | 3 | | 1 |
| $Y_{2/3}$ | | 2 | | 2 | 1 | 3 | | 1 | 3 | 2 | | 2 | |
| $Y_1$ | | 3 | 2 | 1 | 1 | | 3 | 2 | 2 | 1 | | | 3 |

Chart 3

| | $C_0$ | | | | $C_{1/3}$ | | | | $C_{2/3}$ | | | |
|---|---|---|---|---|---|---|---|---|---|---|---|---|
| | $X_0$ | $X_{1/3}$ | $X_{2/3}$ | $X_1$ | $X_0$ | $X_{1/3}$ | $X_{2/3}$ | $X_1$ | $X_0$ | $X_{1/3}$ | $X_{2/3}$ | $X_1$ |
| $Y_0$ | | | | | | | | | | | | | |
| $Y_{1/3}$ | | | | | | | | | 1 | | | 1 | 1 |
| $Y_{2/3}$ | | | 1 | 1 | | | 1 | 1 | | | 1 | 1 | 2 |
| $Y_1$ | | | 1 | 2 | | 1 | 1 | 2 | | 1 | 2 | 2 |

In the charts 2 and 3, $X_0$, $X_{1/3}$, $X_{2/3}$ and $X_1$ denote equivalent logic (X≡0), (X≡$\frac{1}{3}$), (X≡$\frac{2}{3}$), and (X≡1), respectively.

For example, in the case of X=0, the equivalent logic (X≡0), that is, $X_0$ is "1" and other equivalent logic are "0". Similarly, $Y_0$, $Y_{1/3}$, $Y_{2/3}$ and $Y_1$ are equivalent logic (Y≡0), (Y≡$\frac{1}{3}$), (Y≡$\frac{2}{3}$), and (Y≡1), respectively. $C_0$, $C_{1/3}$ and $C_{2/3}$ represent equivalent logic (C≡0), (C≡$\frac{1}{3}$) and (C≡$\frac{2}{3}$), respectively,. The blanks in the charts indicate zero.

The chart 2 indicates a logic expression <Z> of a product of X and Y, that is, (Z1, Z2). The chart 3 indicates a logic expression <C> with respect to a carry output, that is, (C1 C2). In each chart, "1" denotes 01, "2" denotes 10, and "3" denotes 11, respectively.

Figure 7:
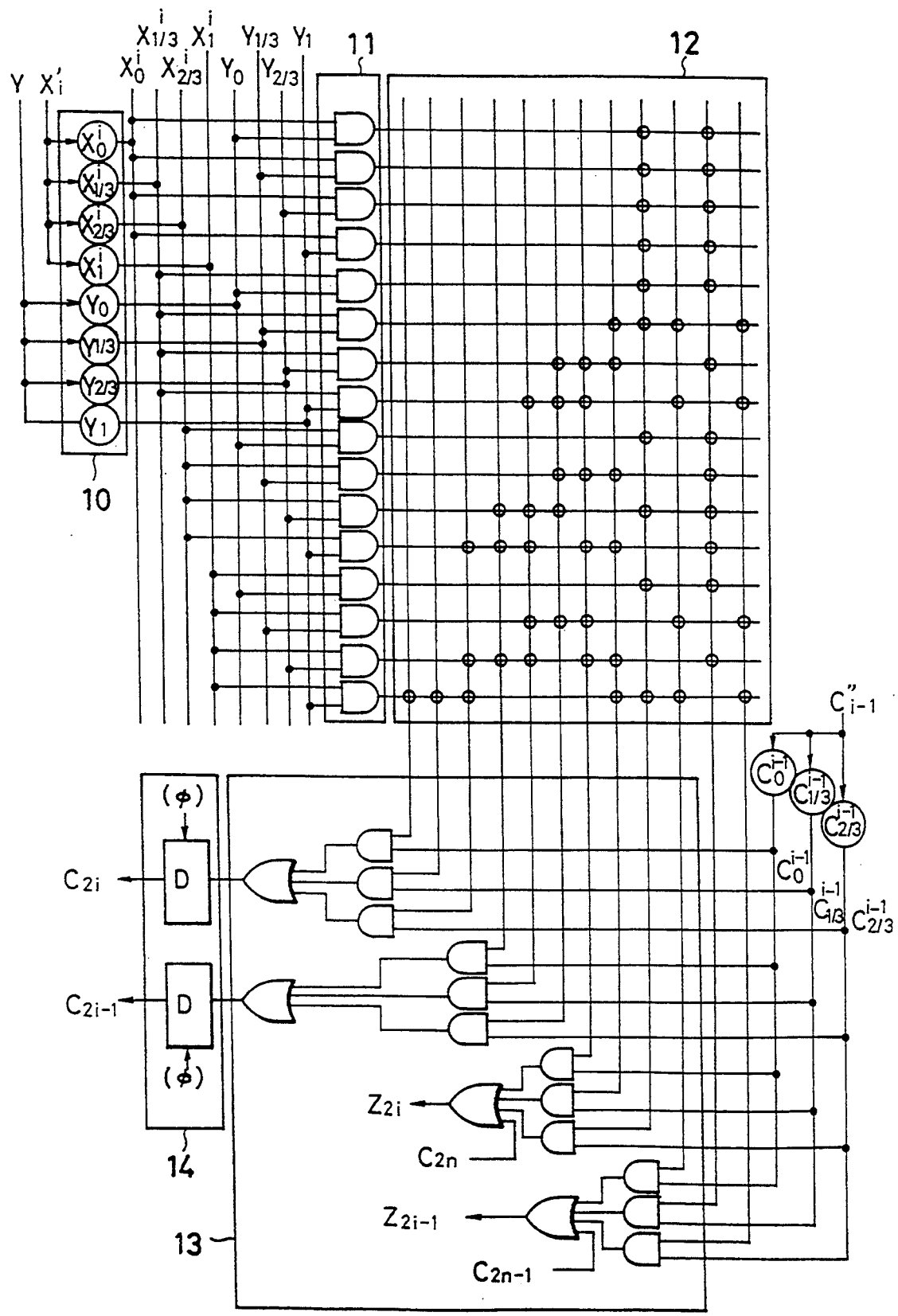
FIG. 7 is a circuit diagram showing a multiplying circuit.

From the above logic expression, the multiplying circuit is arranged as shown in FIG. 7. The multiplying circuit of FIG. 7 includes an equivalent circuit 10, an AND circuit 11, an OR circuit 12, a logic circuit 13 and a delaying circuit 14.

This multiplier executes a multiplication in response to any one of a quadruple signal and a binary signal. Using a quadruple logic, the binary signals $X_{2i}$, $X_{2i-1}$, $Y_2$, $Y_1$, $C_{2i-2}$ and $C_{2i-3}$ are converted into the quadruple signals $X_i'$ and $C''_{i-1}$ according to the chart 4 indicated below.

Chart 4

| $X_{2i}$ | $X_{2i-1}$ | $Y_2$ | $Y_1$ | $C_{2i-2}$ | $C_{2i-3}$ | $X_i'$ | Y | $C_{i-1}''$ |
|---|---|---|---|---|---|---|---|---|
| 0 | 0 | 0 | 0 | 0 | 0 | 0 | 0 | 0 |
| 0 | 1 | 0 | 1 | 0 | 1 | $\frac{1}{3}$ | $\frac{1}{3}$ | $\frac{1}{3}$ |
| 1 | 0 | 1 | 0 | 1 | 0 | $\frac{2}{3}$ | $\frac{2}{3}$ | $\frac{2}{3}$ |
| 1 | 1 | 1 | 1 | X | X | 1 | 1 | X |

The logic expression of the chart 4 is as follows.

$$X_i' = \S X_{2i}X_{2i-1} + \S X_{2i}X_{2i-1} + X_{2i}X_{2i-1}$$
$$Y' = \S Y_2Y_1 + \S Y_2Y_1 + Y_2Y_1 \qquad (3)$$
$$C_{i-1}'' = \S C_{2i-2}C_{2i-3} + \S C_{2i-2}C_{2i-3}$$

Figure 8A:
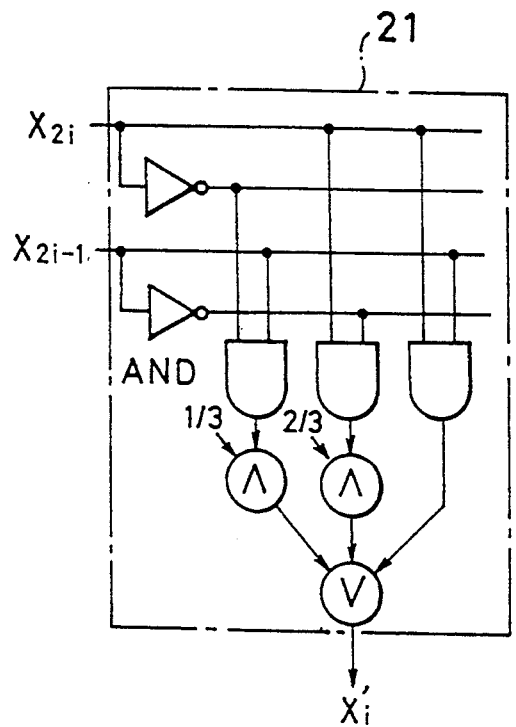
FIGS. 8a, 8b, and 8c are circuit diagrams showing logic converting circuits for binary logic/quadruple signal inputs to the multiplier shown in FIG. 7.
Figure 8B:
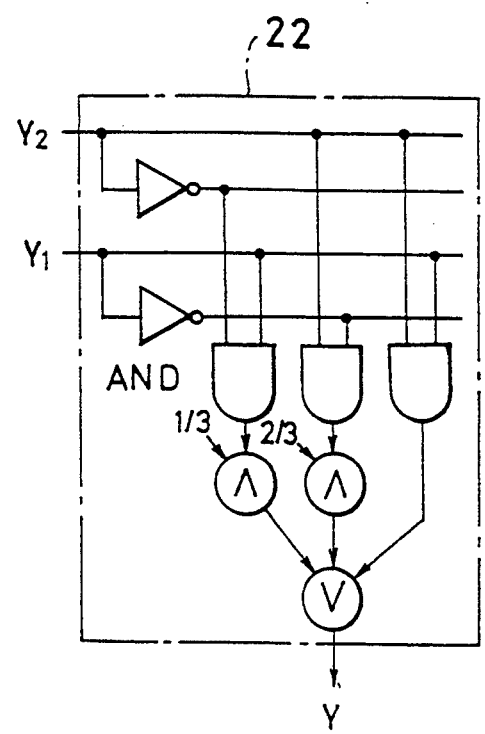
Figure 8C:
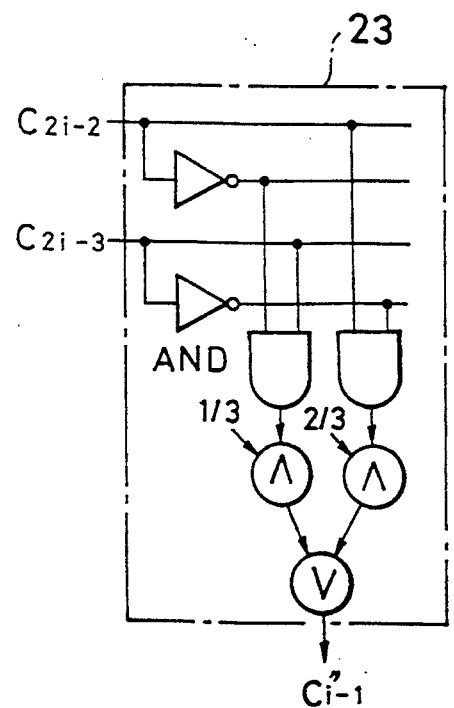
Figure 9A:
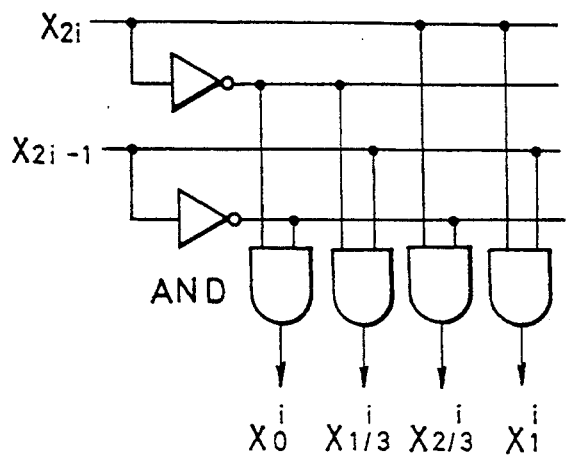
FIGS. 9a, 9b and 9c are circuit diagrams showing input arrangements of binary signals to the multiplier shown in FIG. 7.
Figure 9B:
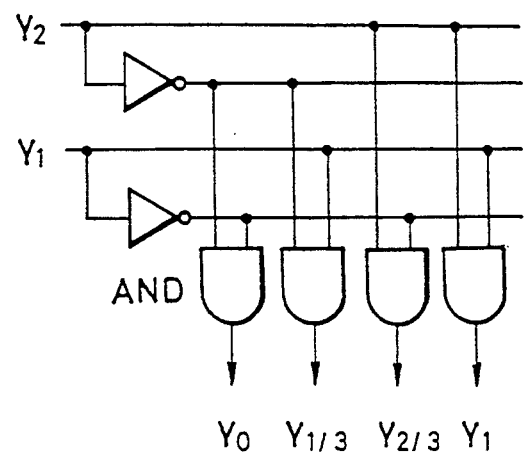
Figure 9C:
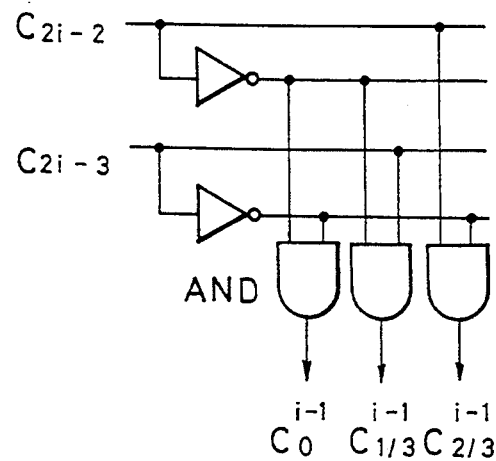

The expression (3) is represented as a logic circuit shown in FIG. 8 composing of FIGS. 8a, 8b, and 8c. For inputting a binary signal, the circuit shown in FIG. 9 composing of FIGS. 9a, 9b and 9c is used. In order to input a binary signal to these circuits, a register converting circuit shown in FIG. 10 is also used.

Figure 10:
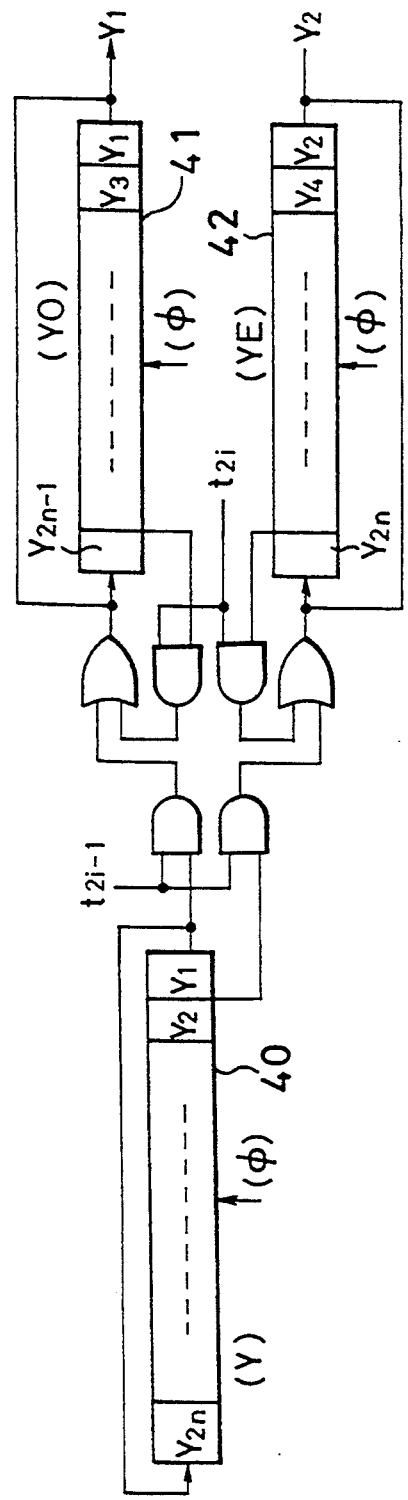
FIG. 10 is a circuit diagram showing an n-bit register converter.

The register converting circuit of FIG. 10 operates to separate 2n-bit data stored in the register 40 into two n-bit data ($Y_1, Y_3, \ldots, Y_{2n-1}$) and ($Y_2, Y_4, \ldots, Y_{2n}$), which are stored in a $Y_O$ register 41 and a $Y_E$ register 42, respectively.

Figure 11:
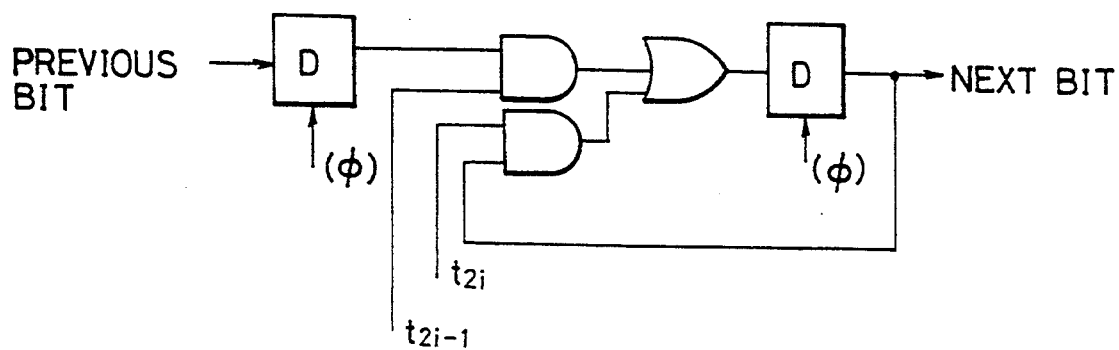
FIG. 11 is a circuit diagram showing a circuit for connecting bits.

The circuit shown in FIG. 11 is used for connecting bits with each other, more concretely, for connecting the $Y_O$ register with the $Y_E$ register of the register converting circuit shown in FIG. 10.

The binary data converted into a two-bit parallel by stream the register converting circuit is input to the binary/quadruple signal converting circuit shown in FIG. 8 or the binary input circuit shown in FIG. 9. In the binary/quadruple signal converting circuit shown in FIG. 8, a symbol Λ stands for a quadruple AND circuit and a symbol V stands for a quadruple OR circuit.

Figure 13:
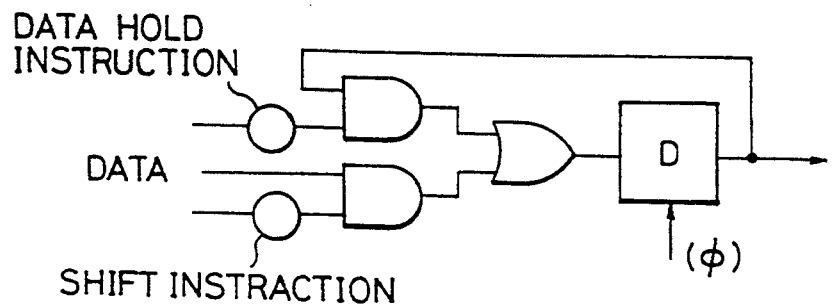
FIG. 13 is a circuit diagram showing a bit circuit.
Figure 12:
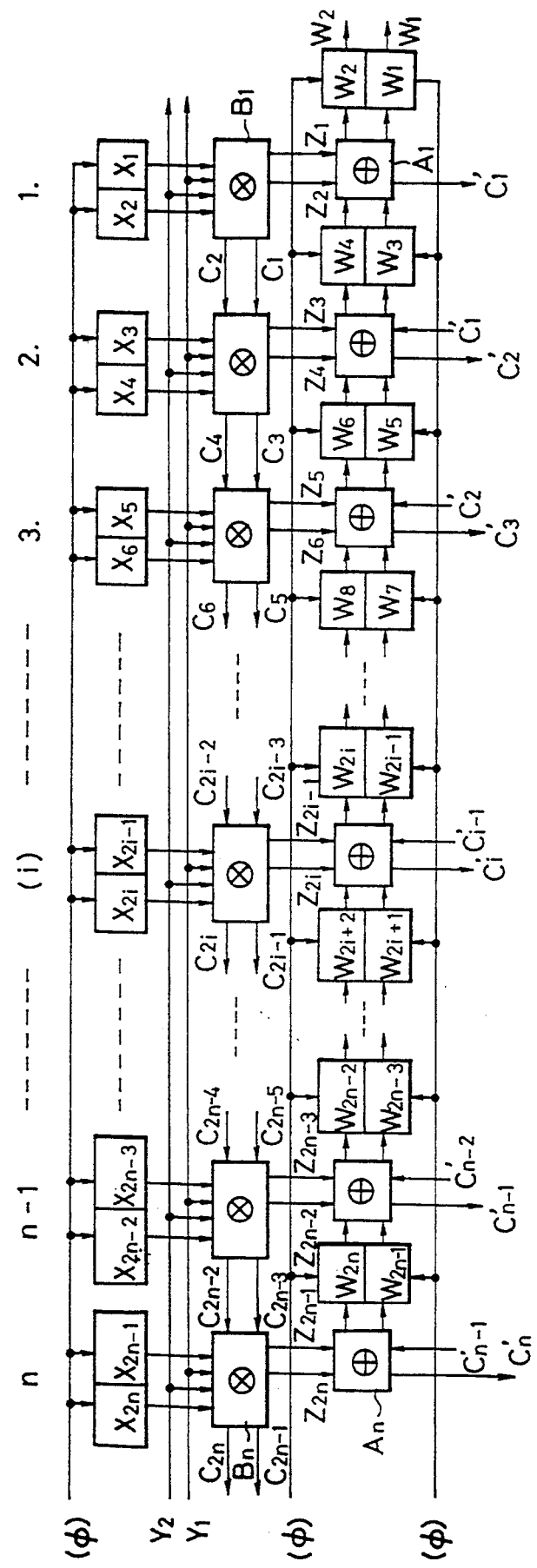
FIG. 12 is a circuit diagram showing an n-bit parallel multiplier.
Figure 14:
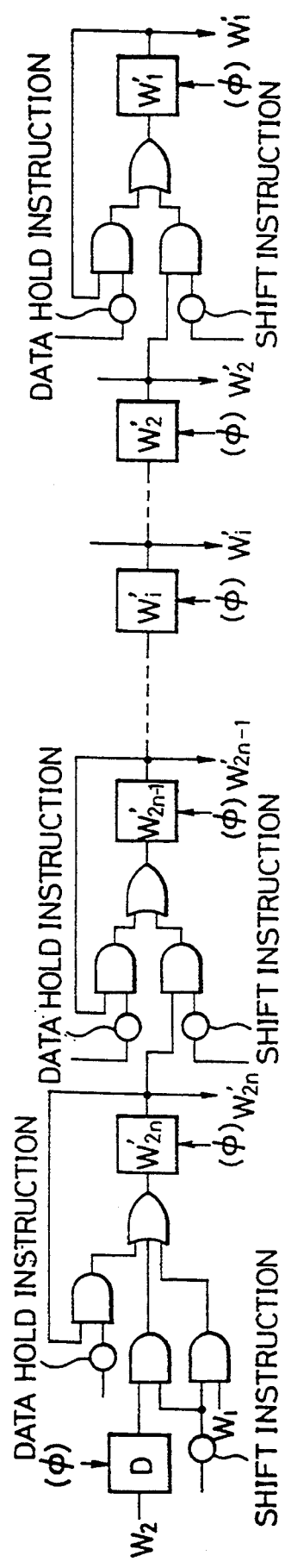
FIG. 14 is a circuit diagram showing a shift register.

FIG. 12 shows a parallel multiplier arranged to have 2-bit units and all bits in parallel. This parallel multiplier includes n of 2-bit multiplying circuits $B_1$ to $B_n$, n of 2-bit adding circuits $A_1$ to $A_n$, and a shift register (W register) for holding XY values. The shift register (W register) is arranged as shown in FIG. 14 and includes the bit circuits shown in FIG. 13.

An input circuit of the X register and that of the W register are different from the circuit for connecting the bits, because of executing the instructions of $(1 \to Y_{2i}, 1 \to Y_{2i-1})$, $(1 \to Y_{2i}, 0 \to Y_{2i-1})$, $(0 \to Y_{2i}, 1 \to Y_{2i-1})$, $(0 \to Y_{2i}, 0 \to Y_{2i-1})$, that is, it shows a connection between the circuits which are in the process of executing an instruction of (XY→W).

Figure 15:
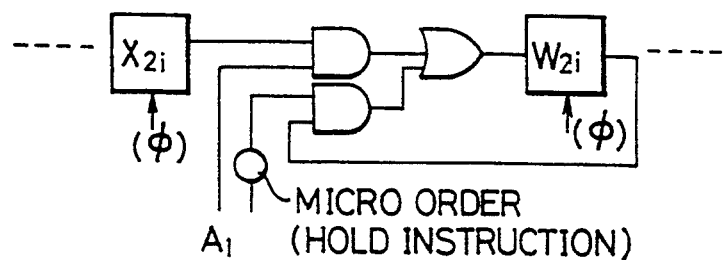
FIG. 15 is a circuit diagram showing an inter-register data transfer of $X_{2i} \rightarrow W_{2i}$.
Figure 16:
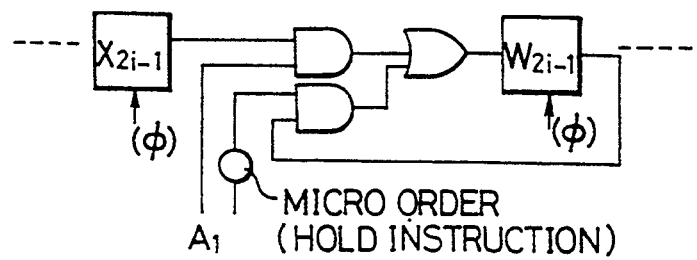
FIG. 16 is a circuit diagram showing an inter-register data transfer circuit of $X_{2i-1} \rightarrow W_{2i-1}$.

More concrete circuits are shown in FIGS. 15 to 19. FIGS. 15 and 16 respectively show a circuit for transferring data between the registers, which has a function of step S22 shown in FIG. 1, for instance.

Figure 17:
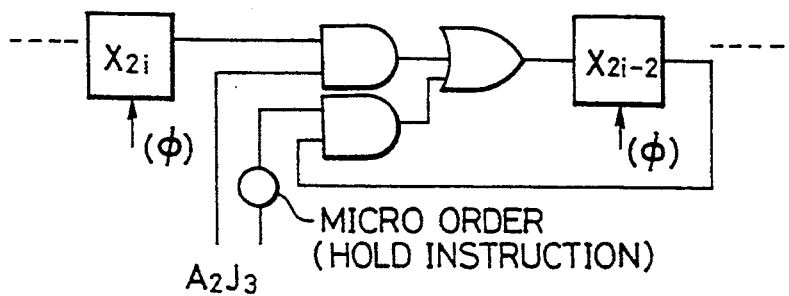
FIG. 17 is a circuit diagram showing a right shift circuit of $X_{2i} \rightarrow X_{2i-2}$.
Figure 18:
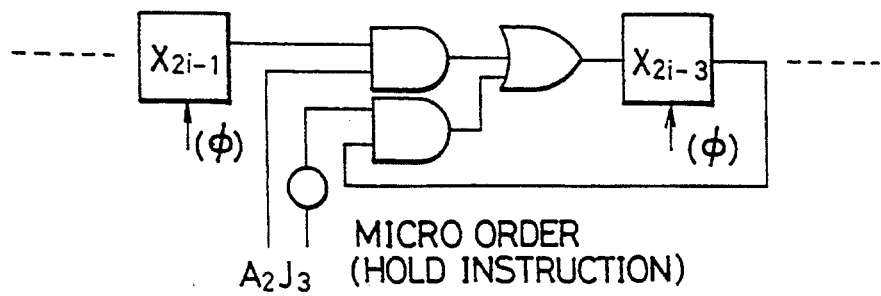
FIG. 18 is a circuit diagram showing a right shift circuit of $X_{2i-1} \rightarrow X_{2i-3}$.

FIGS. 17 and 18 respectively show a right-shift circuit, which performs the function of step S24 shown in FIG. 1.

Figure 19A:
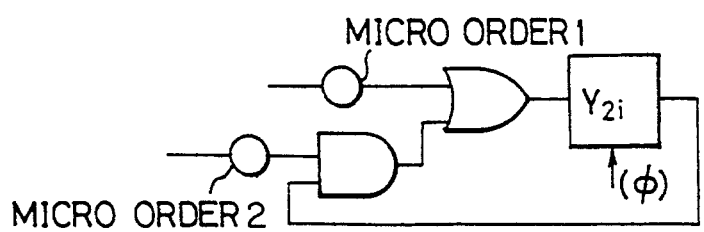
FIGS. 19a and 19b are circuit diagrams showing circuits for executing $0 \rightarrow Y_{2i}$, $1 \rightarrow Y_{2i}$, $0 \rightarrow Y_{2i-1}$, and $1 \rightarrow Y_{2i-1}$.
Figure 19B:
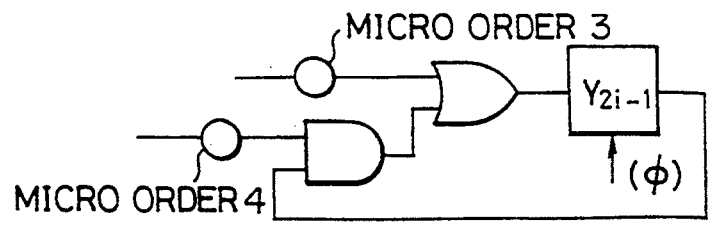

FIGS. 19a and 19b shows circuits for executing $0 \to Y_{2i}$ or $1 \to Y_{2i}$ and $0 \to Y_{2i-1}$ or $1 \to Y_{2i-1}$, and by supplying micro orders 1 to 4 to these circuits according to the following chart 5, the values of $Y_{2i}$ and $Y_{2i-1}$ may be set as "0" or "1".

Chart 5

| ① | ② | ③ | ④ | $Y_{2i}$ | $Y_{2i-1}$ | |
|---|---|---|---|---|---|---|
| 0 | 0 | 0 | 0 | 0 | 0 | "0" |
| 0 | 1 | 0 | 1 | HOLD | | |
| 0 | 0 | 1 | 0 | 0 | 1 | "1" |
| 1 | 0 | 0 | 0 | 1 | 0 | "2" |
| 1 | 0 | 1 | 0 | 1 | 1 | "3" |

① = $A_3 + A_5 J_3$
③ = $A_3 + A_7 J_3$

Figure 20:
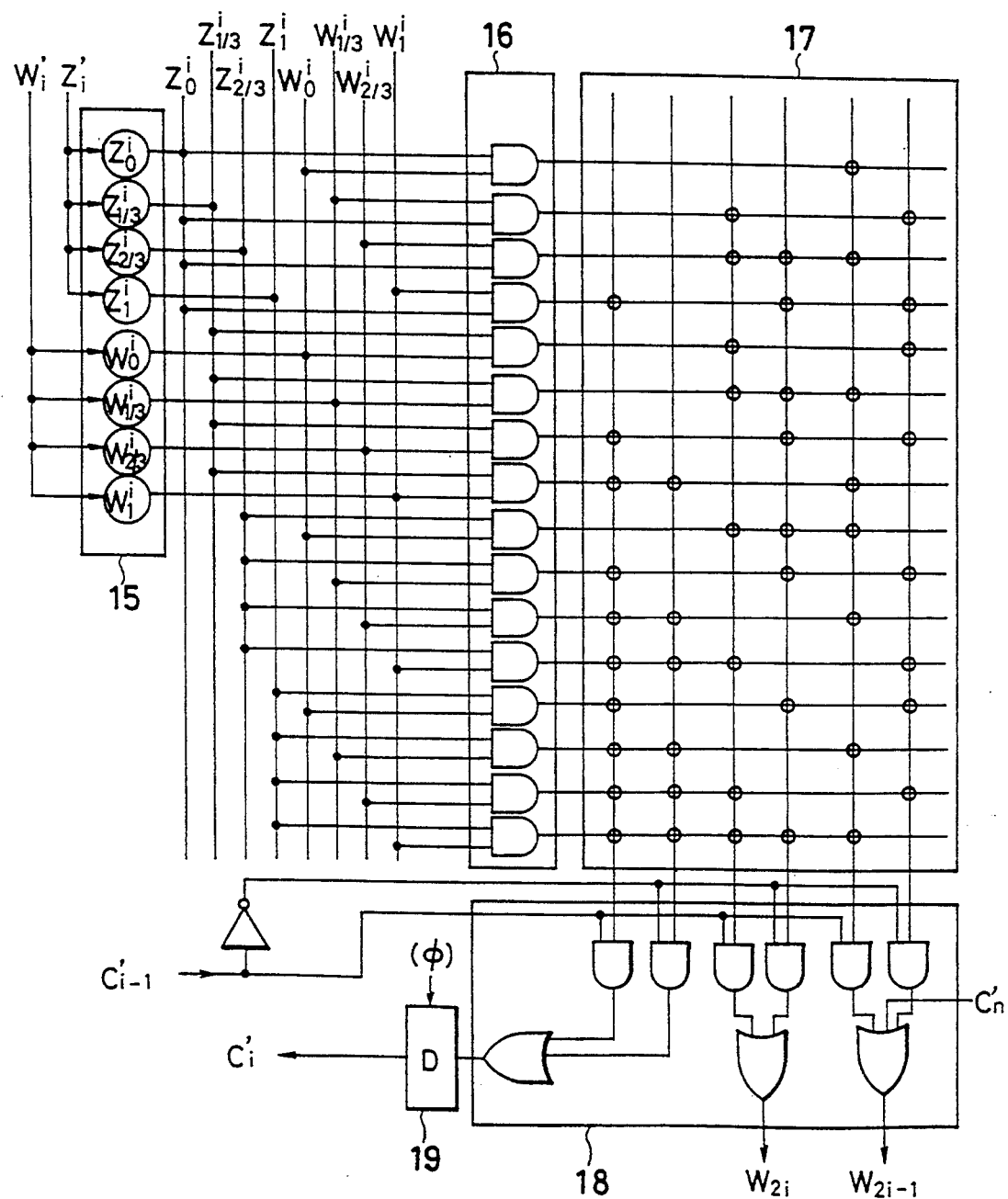
FIG. 20 is a circuit diagram showing an adding circuit.

FIG. 20 shows an adding circuit, which indicates the details of the partial components $A_1$ to $A_n$ of the parallel multiplier shown in FIG. 12.

The adding circuit shown in FIG. 20 includes an equivalent circuit 15, an AND circuit 16, an OR circuit 17, a logic circuit 18, and a delay circuit 19. The logic of the adding circuit is the same as that disclosed in the Japanese Patent Application laying Open (KOKAI) No. H5-073269 and the circuit arrangement is the same as that disclosed in the Japanese Patent Application laying Open (KOKAI) No. H5-158659.

The logic of the adding circuit shown in FIG. 20 may be represented by the following chart. The charts 6-1, 6-2, 6-3 and 6-4 may be described similarly to the logic of the multiplier described above, therefore the description about those charts will be omitted.

Chart 6-1

| | $Z_0$ | $Z_{1/3}$ | $Z_{2/3}$ | $Z_1$ |
|---|---|---|---|---|
| $W_0$ | | 1 | 2 | 3 |
| $W_{1/3}$ | 1 | 2 | 3 | |
| $W_{2/3}$ | 2 | 3 | | 1 |
| $W_1$ | 3 | | 1 | 2 |

Addition Output $C_{i-1}' = 1$

Chart 6-2

| | $Z_0$ | $Z_{1/3}$ | $Z_{2/3}$ | $Z_1$ |
|---|---|---|---|---|
| $W_0$ | 1 | 2 | 3 | |
| $W_{1/3}$ | 2 | 3 | | 1 |
| $W_{2/3}$ | 3 | | 1 | 2 |
| $W_1$ | | 1 | 2 | 3 |

Addition Output $C_{i=1}' = 1$

Chart 6-3

| | $Z_0$ | $Z_{1/3}$ | $Z_{2/3}$ | $Z_1$ |
|---|---|---|---|---|
| $W_0$ | | | | |
| $W_{1/3}$ | | | | 1 |
| $W_{2/3}$ | | | 1 | 1 |
| $W_1$ | | 1 | 1 | 1 |

Carry Output

Chart 6-4

| | $Z_0$ | $Z_{1/3}$ | $Z_{2/3}$ | $Z_1$ |
|---|---|---|---|---|
| $W_0$ | | | | 1 |
| $W_{1/3}$ | | | 1 | 1 |
| $W_{2/3}$ | | 1 | 1 | 1 |
| $W_1$ | 1 | 1 | 1 | 1 |

Carry Output

Figure 21A:
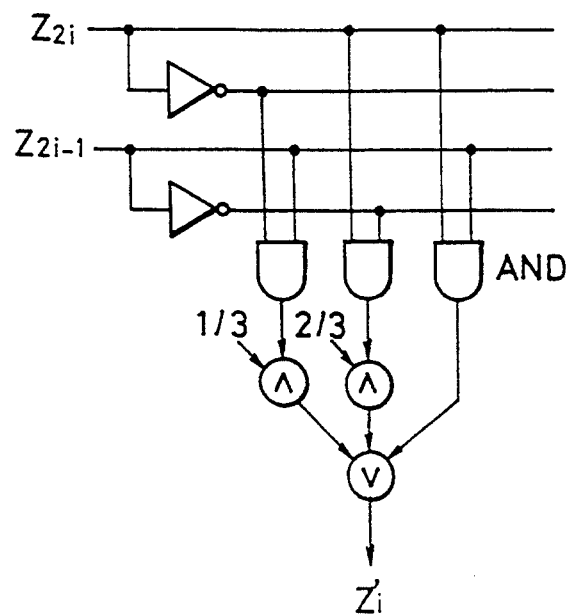
FIGS. 21a and 21b are circuit diagrams showing logic converting circuits for binary logic/quadruple signals to the adding circuit shown in FIG. 20.
Figure 21B:
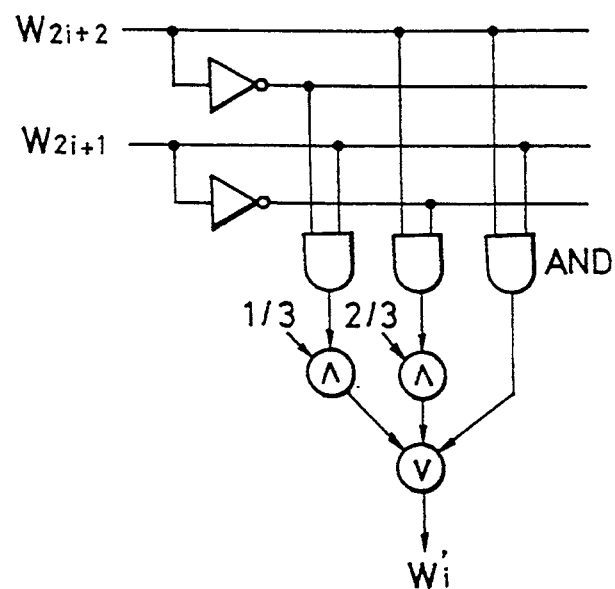

When a quadruple logic is used in the adding circuit shown in FIG. 21, the binary signals $Z_{2i}$, $Z_{2i-1}$ and $W_{2i+2}$ and $W_{2i+1}$ are converted into the quadruple signals $Z_i'$ and $W_i'$ as shown in FIGS. 21a and 21b. In FIG. 21, a symbol Λ stands for a quadruple AND circuit and a symbol V stands for a quadruple OR circuit.

Figure 22A:
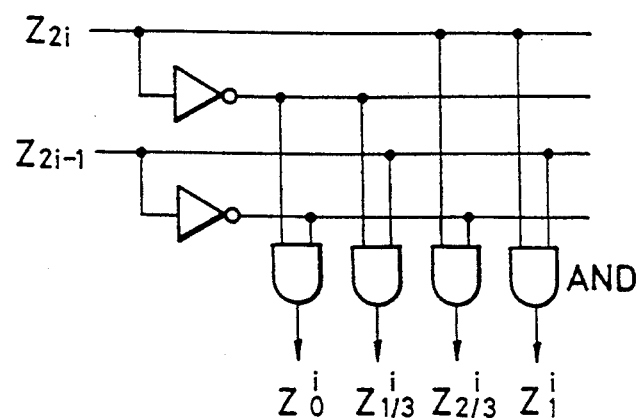
FIGS. 22a and 22b are circuit diagrams showing an input circuit for a binary signal to the adding circuit shown in FIG. 20.
Figure 22B:
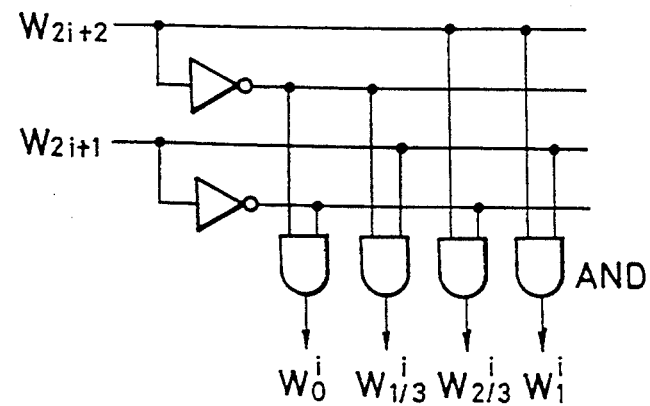

When the binary logic is used, the binary logic input circuit shown in FIGS. 22a and 22b serves to convert the binary signals $Z_{2i}$, $Z_{2i-1}$ and $W_{2i+2}$, $W_{2i+1}$ into the signals $Z_0^i$, $Z_{\frac{1}{3}}^i$, $Z_{\frac{2}{3}}^i$, $Z_1^i$ and $W_0^i$, $W_{\frac{1}{3}}^i$, $W_{\frac{2}{3}}^i$ and $W_1^i$, respectively.

In turn, a logic and a circuit arrangement of a comparator for executing a comparative operation with respect to a division will be described.

The chart 7 indicates the condition for meeting $S_i > W_i$, the chart 8 indicates the condition for meeting $S_i = W_i$, and the chart 9 indicates the condition for meeting $S_i < W_i$.

Chart 7

|  | $S_0^i$ | $S_{1/3}^i$ | $S_{2/3}^i$ | $S_1^i$ |
|---|---|---|---|---|
| $W_0^i$ |  | 1 | 1 | 1 |
| $W_{1/3}^i$ |  |  | 1 | 1 |
| $W_{2/3}^i$ |  |  |  | 1 |
| $W_1^i$ |  |  |  |  |

Chart 8

|  | $S_0^i$ | $S_{1/3}^i$ | $S_{2/3}^i$ | $S_1^i$ |
|---|---|---|---|---|
| $W_0^i$ | 1 |  |  |  |
| $W_{1/3}^i$ |  | 1 |  |  |
| $W_{2/3}^i$ |  |  | 1 |  |
| $W_1^i$ |  |  |  | 1 |

Chart 9

|  | $S_0^i$ | $S_{1/3}^i$ | $S_{2/3}^i$ | $S_1^i$ |
|---|---|---|---|---|
| $W_0^i$ |  |  |  |  |
| $W_{1/3}^i$ | 1 |  |  |  |
| $W_{2/3}^i$ | 1 | 1 |  |  |
| $W_1^i$ | 1 | 1 | 1 |  |

In each of the charts, $S_0$, $S_{\frac{1}{3}}$, $S_{\frac{2}{3}}$ and $S_1$ denote equivalent logic ($S \equiv 0$), ($S \equiv \frac{1}{3}$), ($S \equiv \frac{2}{3}$) and ($S \equiv 1$). Likewise, $W_0$, $W_{\frac{1}{3}}$, $W_{\frac{2}{3}}$ and $W_1$ denote equivalent logic ($W \equiv 0$), ($W \equiv \frac{1}{3}$), ($W \equiv \frac{2}{3}$), and ($W \equiv 1$), respectively.

Figure 23:
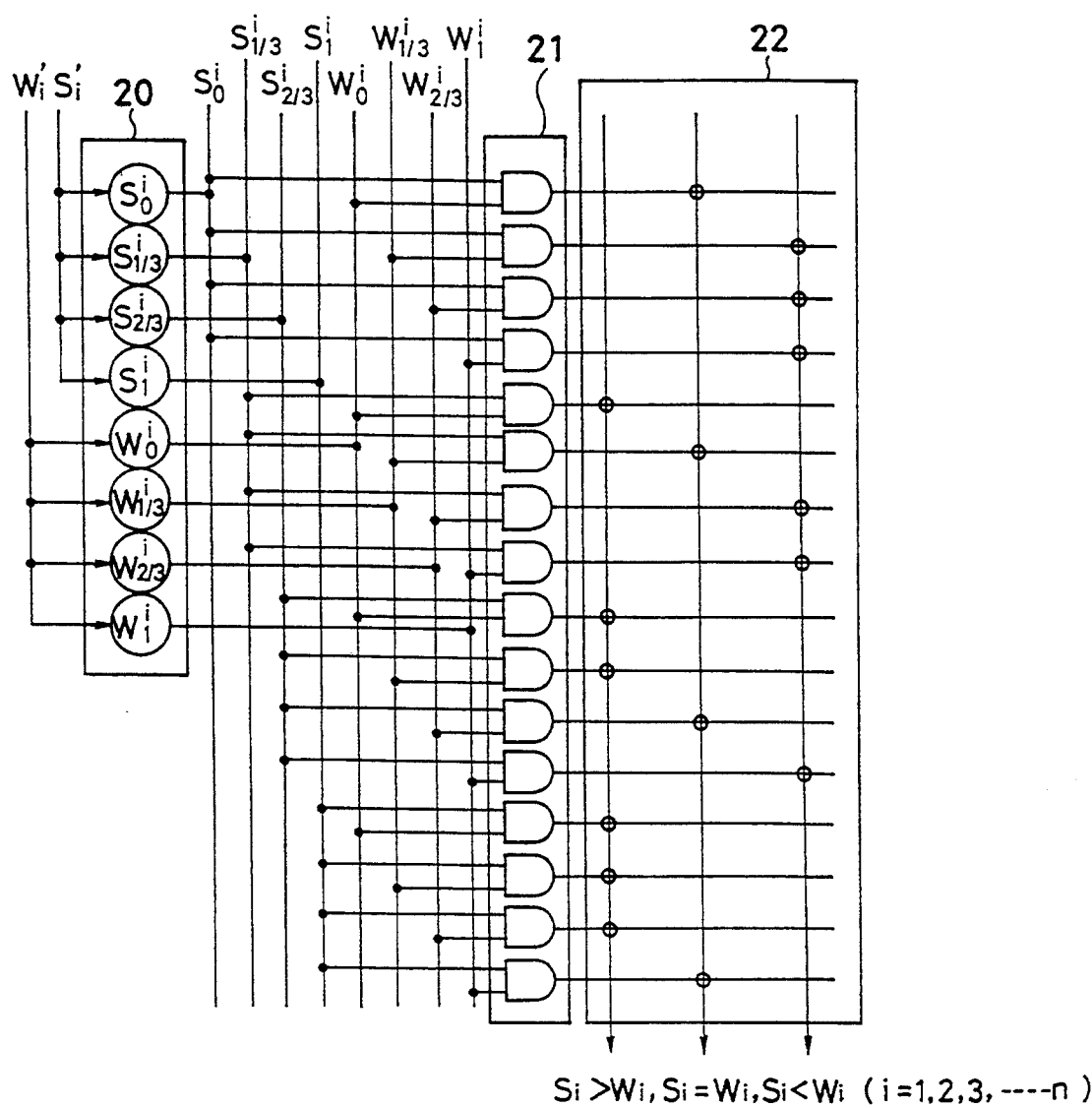
FIG. 23 is a circuit diagram showing a comparing circuit included in the divide circuit according to the present invention.
Figure 24:
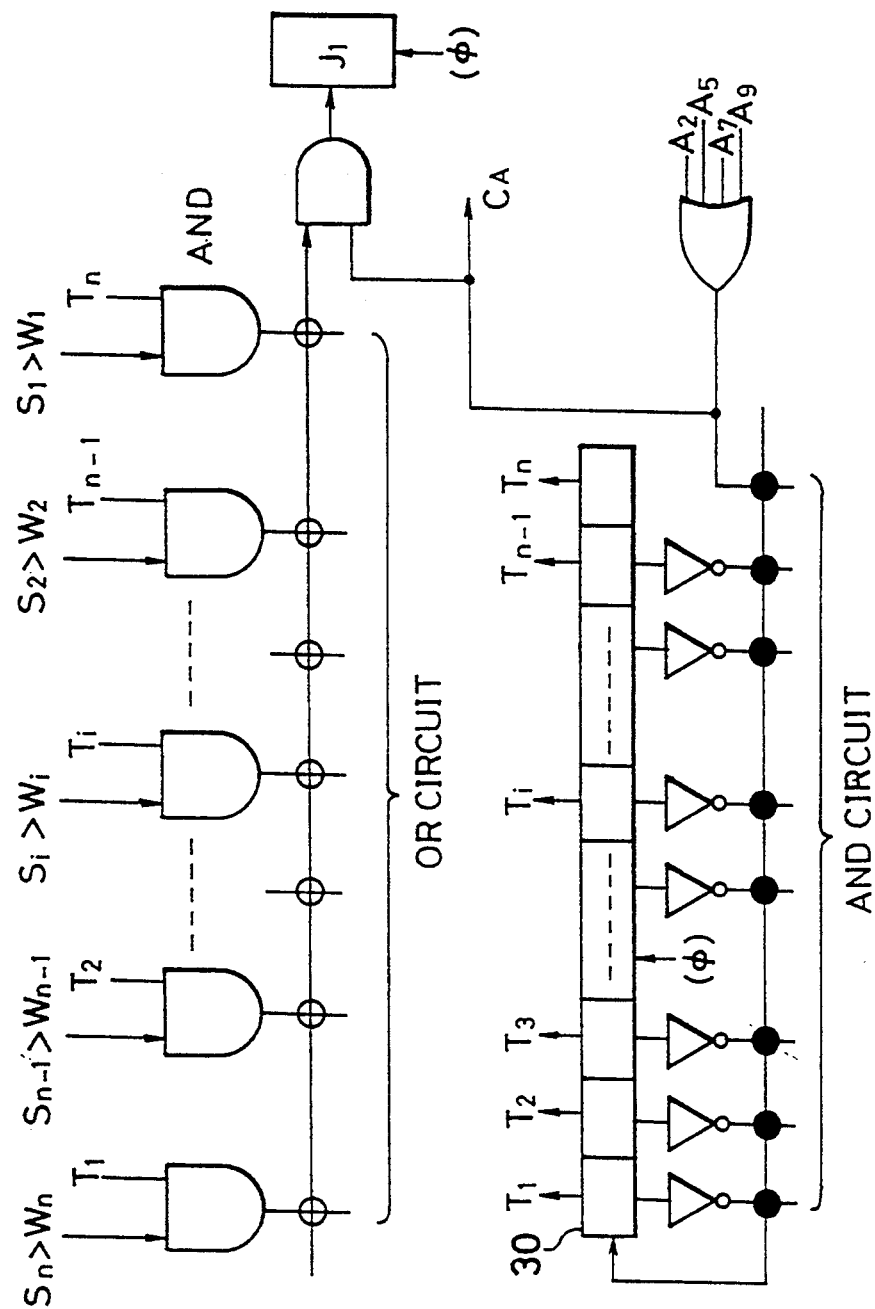
FIG. 24 is a circuit diagram showing an $S>W$ determining circuit included in the divide circuit.
Figure 25:
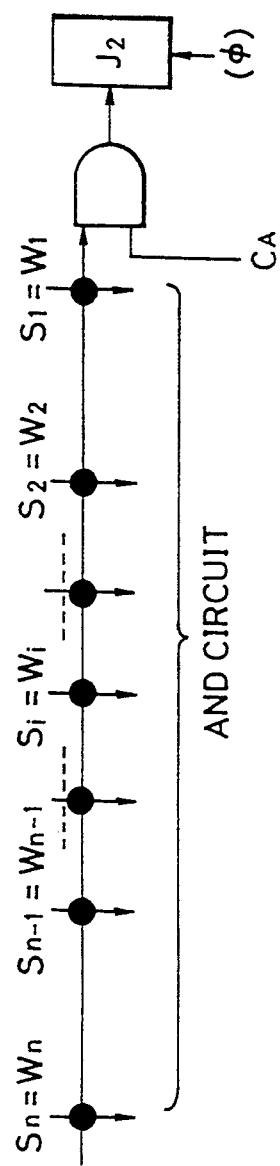
FIG. 25 is a circuit diagram showing an $S=W$ determining circuit included in the divide circuit.
Figure 26:
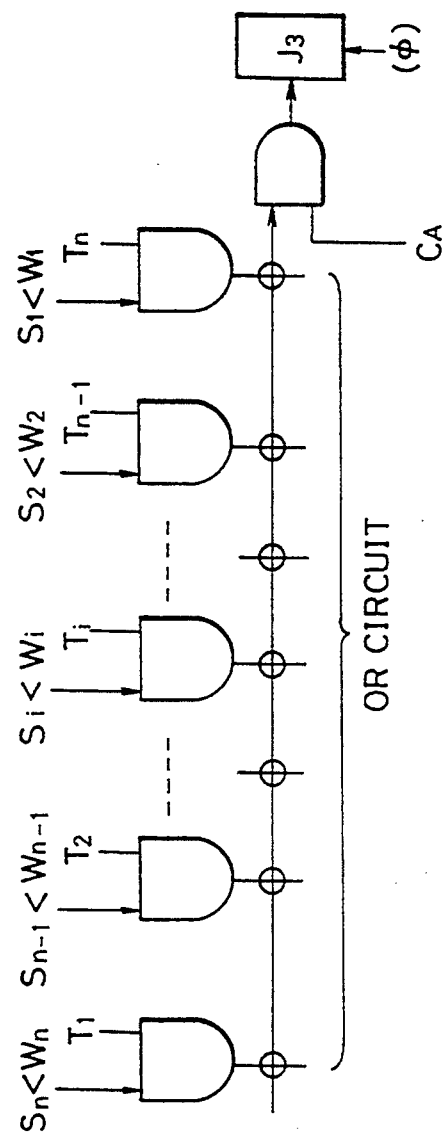
FIG. 26 is a circuit diagram showing an $S<W$ determining circuit included in the divide circuit.
Figure 27:
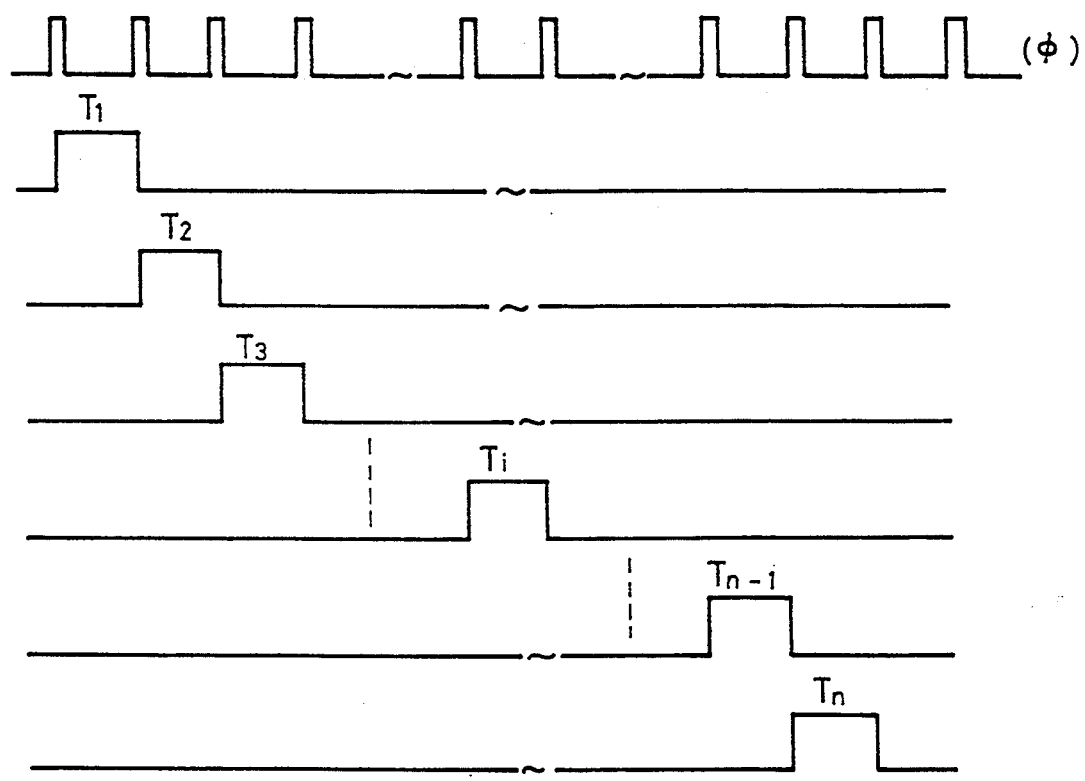
FIG. 27 is a waveform diagram showing a pulse output by a search timing output circuit shown in FIG. 24.

As is understood from the above charts, the comparator may include an equivalent circuit 20, an AND circuit 21, and an OR circuit 22 as shown in FIG. 23. This comparator is used for comparing S with W on each corresponding digit, but in order to execute the comparison of S with W, it is necessary to compare S with W on all the digits. The circuit for determining whether or not $S > W$ is shown in FIG. 24, the circuit for determining whether or not $S = W$ is shown in FIG. 25, and the circuit for determining whether or not $S < W$ is as shown in FIG. 26, respectively. In these figures, a symbol ○ indicates an OR circuit, a symbol ● indicates an AND circuit. On the timing shown in FIG. 27, search signals $T_1$ to $T_n$ are supplied to the AND gate to which the compared results on each digit sent from the circuits of FIGS. 24 to 26 are applied.

Figure 28A:
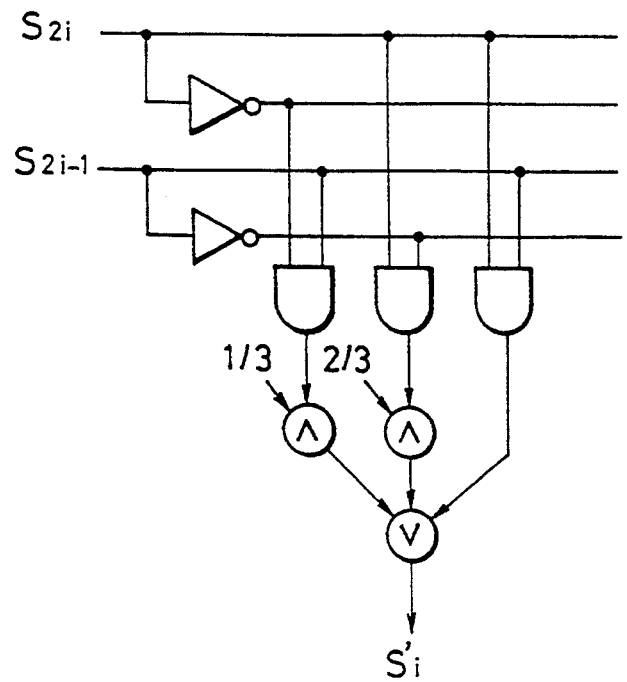
FIGS. 28a and 28b are circuit diagrams showing logic converting circuits for binary signal/quadruple signals.
Figure 28B:
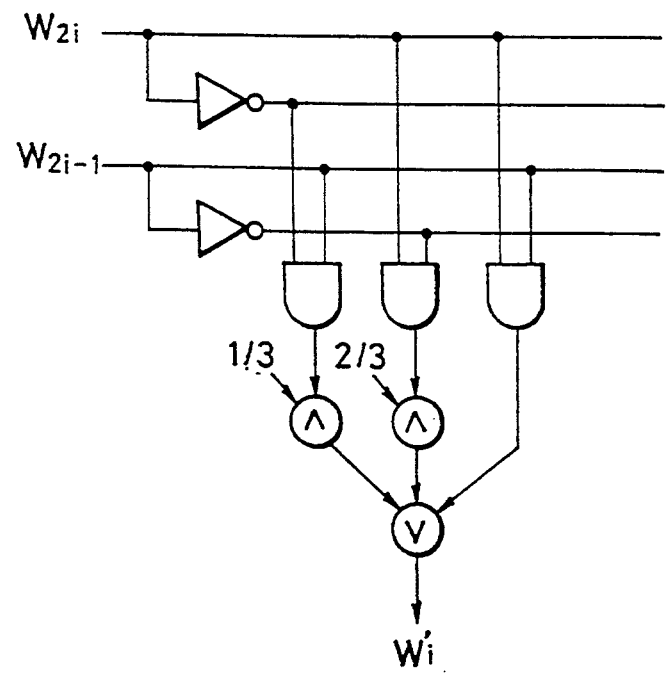

When the comparator uses a quadruple logic, the binary signals $S_{2i}$, $S_{2i-1}$ and $W_{2i}$ and $W_{2i-1}$ are converted into the quadruple signals $S_i'$ and $W_i'$ through the logic converting circuit shown in FIG. 28 composing of FIGS. 28a and 28b, respectively.

Figure 29A:
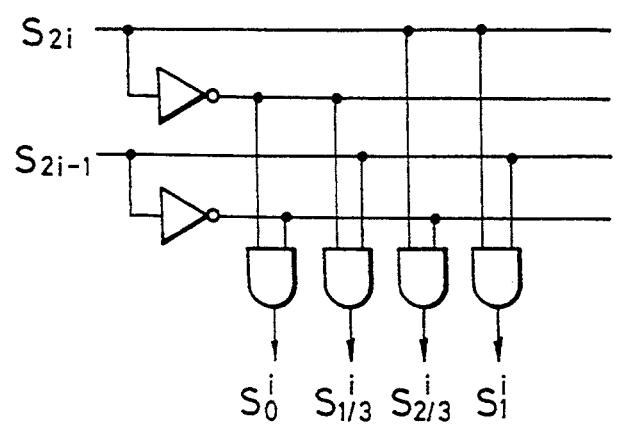
FIGS. 29a and 29b are circuit diagrams showing binary input circuits for binary logic.
Figure 29B:
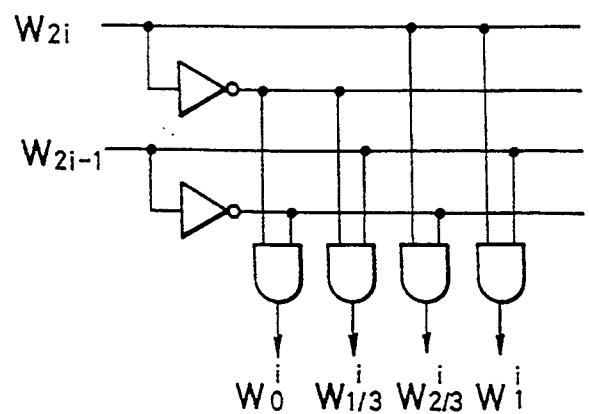

When the binary logic is used, the binary signals $S_{2i}$, $S_{2i-1}$ and $W_{2i}$, $W_{2i-1}$ are converted into the signals $S_0^i$, $S_{\frac{1}{3}}^i$, $S_{\frac{2}{3}}^i$, $S_1^i$ and $W_0^i$, $W_{\frac{1}{3}}^i$, $W_{\frac{2}{3}}^i$ and $W_1^i$ through the binary input circuit shown in FIGS. 29a and 29b, respectively.

The compared result of each digit of the division according to this embodiment is determined after n bit time at maximum and is input to the OR circuit of the circuit for determining $S > W$. At a time, the search signal is supplied to the compared result in sequence from the most significant digit, and when a value of "1" rises on a certain digit, it is determined $S > W$, and then J1 is set to become a value of "1". This is true for the determination of $S < W$. When S is equal to W for all the digits ($S_n = W_n$, $S_{n-1} = W_{n-1}$, ..., $S_i = W_i$, ..., $S_2 = W_2$, $S_1 = W_1$), it is determined that $S = W$, and then J2 is set to a value of "1".

Such a determining method makes it possible to determine the compared result far faster than the known method for detecting a borrow output of a subtraction and determining which of the borrow outputs is larger.

Figure 30:
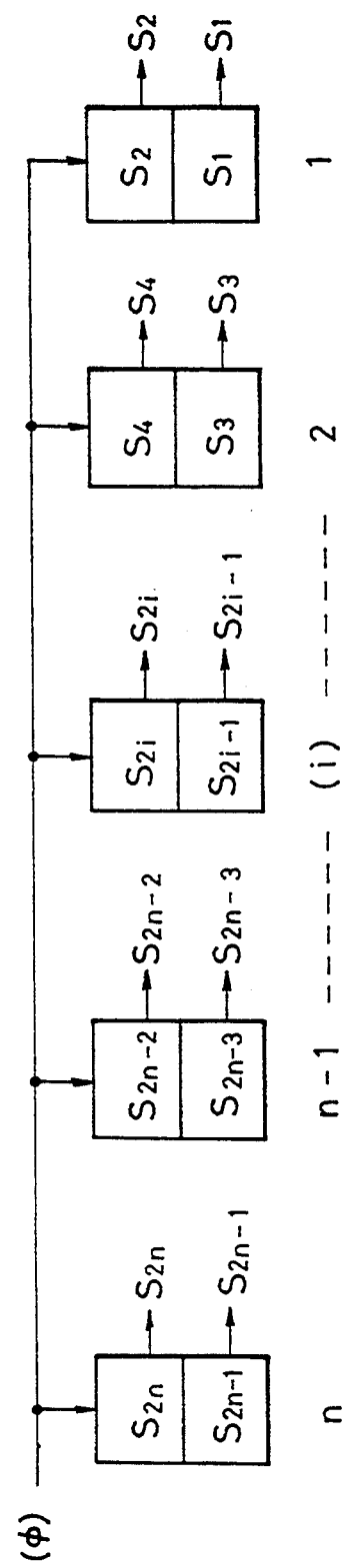
FIG. 30 is a circuit diagram showing an arrangement of an S register.
Figure 31:
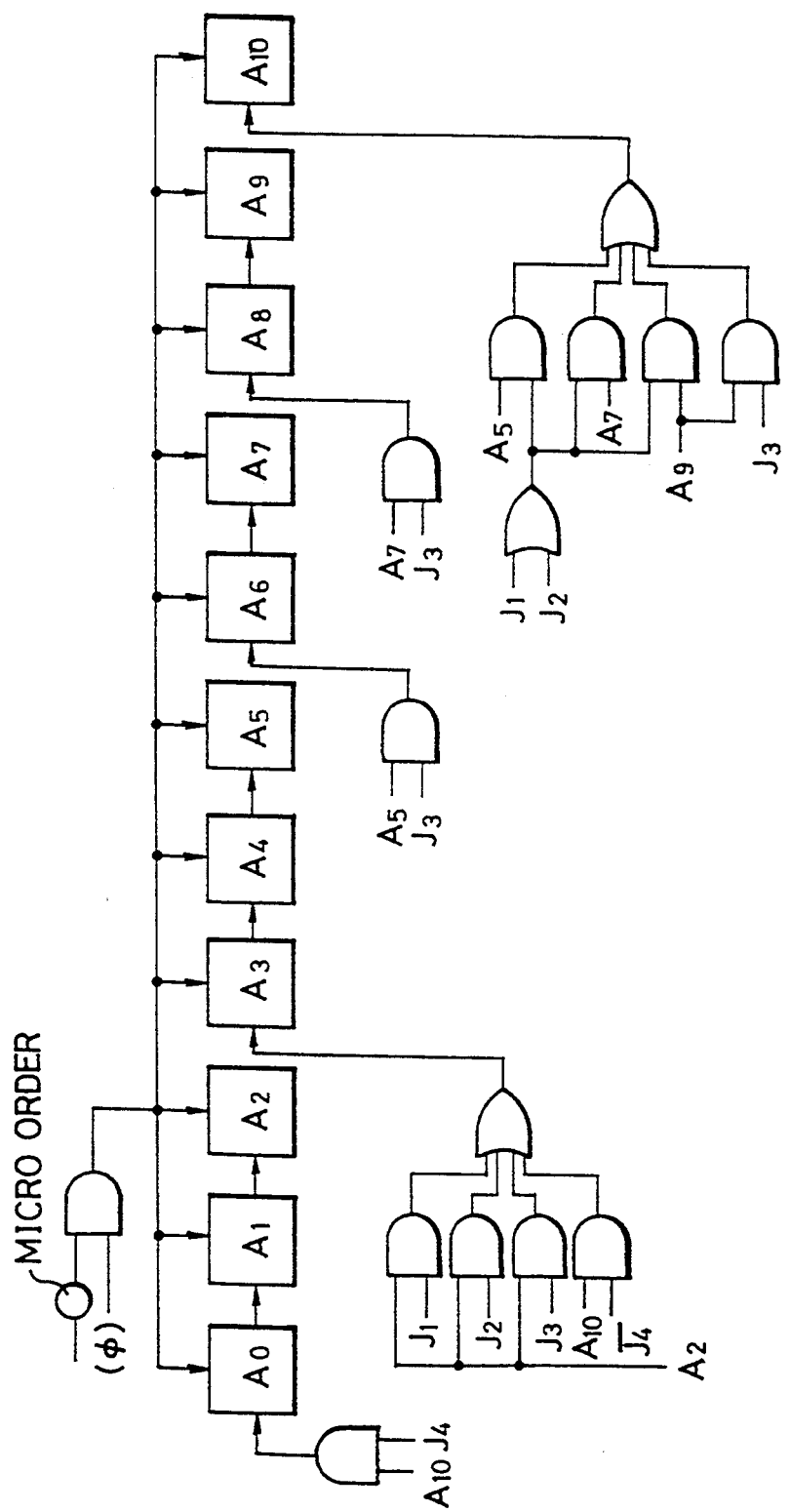
FIG. 31 is a circuit diagram showing an address circuit.
Figure 32:
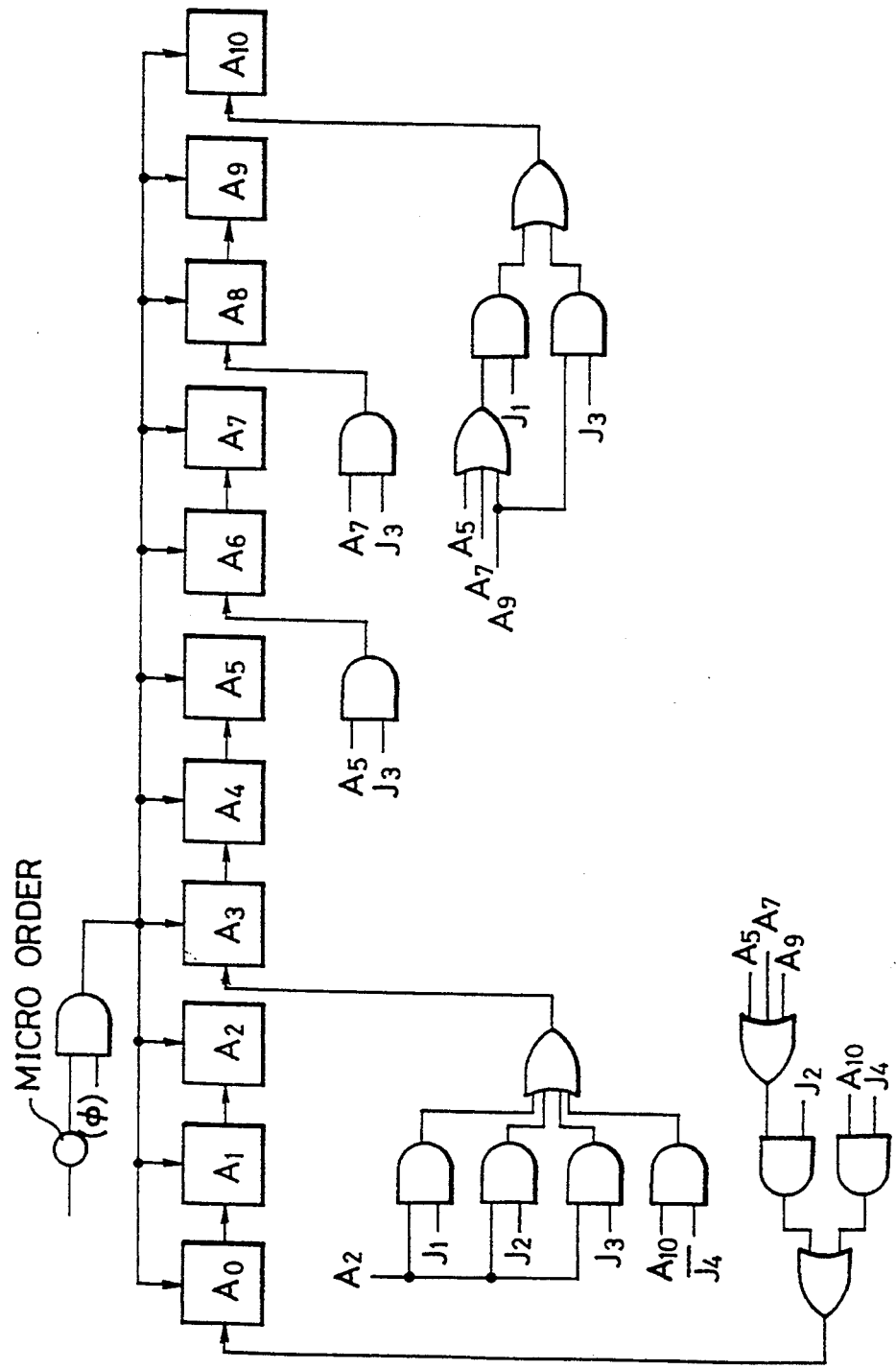
FIG. 32 is a circuit diagram showing another address circuit.

FIG. 30 shows an arrangement of the S register, FIG. 31 shows an address circuit for executing a program shown in FIG. 2, and FIG. 32 shows an address circuit for executing a program shown in FIG. 4.

In FIG. 31, J4 is a circuit to be set when $i=1$ and may be implemented by known techniques. The symbol of i indicating each digit number used in the flowchart or the program is used for clarity and the circuit such as a counter, permits to automatically executing the operation of $i-1 \rightarrow i$.

Next, the time consumed in the dividing system according to this embodiment is considered.

For executing the division with an n-bit dividend and an n-bit divisor, the multiplication of X and Y needs a n-bit time, and in order to obtain a quotient per one digit, it is necessary to do three multiplications at maximum. Since the multiplication is done when a logic value is "0", in actual, four multiplications at maximum are needed. It means that the multiplication needs a 4n-bit time. Since the multiplication is repeated n/2 time, that is, by n/2 digit, it takes $2n^2$-bit time to obtain the multiplied result on all the digits.

When this operation is used for binary multiplication with all bits, two times of multiplications at maximum are approximately required to be executed, and this results in requiring a time of $2n \times 2 \times n$, that is, $4n^2$ bit-time is required for executing all the multiplications.

This means that the approximate maximum bit time is reduced to a half, that is, the dividing speed is doubled. At a time, if a physical clock frequency is reduced to a half, no change takes place with respect to the dividing speed.

FIG. 33 shows the relation between a bit time and the dividing speed expanded with respect to an N value. In FIG. 33, which illustrates a graph of parallel division (nbit/nbit) time:

$$T \simeq \frac{2n}{m} \times 2^m \times \frac{n}{m}$$

$$\simeq 2N(n\log 2/\log N)^2$$

As is understood from FIG. 33, the quadruple logic is practically the most appropriate. This embodiment has been described about the divide circuit, but it may offer the same effect to the multiplying circuit. The dividing method described herein may be used as a serial type dividing method as disclosed in the Japanese Patent Application laying Open (KOKAI) No. H5-158659.

Many widely different embodiments of the present invention may be constructed without departing from the spirit and scope of the present invention. It should be understood that the present invention is not limited to the specific embodiments described in the specification, except as defined in the appended claims.

What is claimed is:

1. A divide circuit for deriving a quotient from a dividend and a divisor, said dividend and said divisor being in one of quaternary logic and binary logic, said divide circuit comprising:
    setting means for setting a digit of a candidate value, which is composed of a plurality of positions, of said quotient from a most significant position to a least significant position;
    multiplying means, connected to said setting means, for multiplying said candidate value by said divisor;
    comparing means, connected to said multiplying means and said setting means, for comparing a multiplying result with said dividend, from the most significant position to the least significant position, and for determining a greater value where one of the digits of said multiplying result is different from a corresponding digit of said dividend; and
    outputting means, connected to said comparing means, for outputting said candidate value as said quotient, when said multiplying result is equal to said dividend;
    said setting means including,
        changing means for changing a digit at a present position, until said comparing means determines that one of said multiplying result and said dividend is greater than the other.

2. A divide circuit according to claim 1, wherein said setting means sets each digit of said candidate value from a greatest number and changes said digit at the present position by decreasing stepwisely said digit, until said comparing means determines said dividend is greater than said multiplying result.

3. A divide circuit according to claim 1, wherein said setting means sets each digit of said candidate value from a least number and changes said digit at the present position by increasing stepwisely said digit, until said comparing means determines said multiplying result is greater than said dividend.

4. A divide circuit according to claim 2 or 3, wherein said outputting means outputs said candidate value as said quotient, when the least significant digit of said candidate value is set.

5. A divide circuit according to claim 4, wherein said divide circuit further comprises,
    converting means for converting said dividend and said divisor in binary logic into a dividend and a divisor in quaternary logic.

6. A divide circuit according to claim 4, wherein each of said multiplying means and said comparing means includes a converting circuit for converting a signal in binary logic into a signal in quaternary logic.

7. A divide circuit according to claim 6, wherein said converting circuit includes an AND circuit and an OR circuit for quaternary logic.

8. A divide circuit according to claim 4, wherein said multiplying means includes an equivalent circuit for receiving said divisor and said candidate value and for outputting equivalent values of said divisor and said candidate value, respectively.

9. A divide circuit according to claim 8, wherein said multiplying means further includes an AND circuit connected to said equivalent circuit for executing AND logic on said equivalent values output from said equivalent circuit and for outputting a result of said AND logic.

10. A divide circuit according to claim 9, wherein said multiplying means further includes an OR circuit, connected to said AND circuit, for executing OR logic on said result of said AND circuit and for outputting a result of said OR logic.

11. A divide circuit according to claim 10, wherein said multiplying means further includes a logic circuit, connected to said OR circuit, for executing AND logic on said result of said OR circuit and a carry input, for executing OR logic on said result of AND logic, and for outputting a result of said OR logic.

12. A divide circuit according to claim 11, wherein said multiplying means further includes a delaying circuit, connected to said logic circuit, for delaying said result of said logic circuit.

13. A divide circuit according to claim 4, wherein said comparing means includes an equivalent circuit for receiving said dividend and said multiplying result and for outputting equivalent values of said dividend and said candidate value, respectively.

14. A divide circuit according to claim 13, wherein said comparing means further includes an AND circuit, connected to said equivalent circuit, for executing AND logic on said equivalent values output from said equivalent circuit and for outputting a result of said AND logic.

15. A divide circuit according to claim 14, wherein said comparing means further includes an OR circuit, connected to said AND circuit, for executing OR logic on said result of said AND circuit and for outputting a result of said OR logic.

16. A divide circuit according to claim 4, wherein said comparing means further includes a first determining circuit for determining that said dividend is greater than said multiplying result, by comparing said dividend with said multiplying result from the most significant position to the least significant position.

17. A divide circuit according to claim 16, wherein said comparing means further includes a second determining circuit for determining that said dividend is equal to said multiplying result, by comparing said dividend with said multiplying result from the most significant position to the least significant position.

18. A divide circuit according to claim 17, wherein said comparing means further includes a third determining circuit for determining that said multiplying result is greater than said dividend by comparing said dividend with said multiplying result from the most significant position to the least significant position.

19. A divide circuit according to claim 18, wherein each of said first determining circuit, said second determining circuit, and said third determining circuit compares said dividend with said multiplying result in accordance with a search signal, searching different digits from the most significant position to the least significant position.

* * * * *

UNITED STATES PATENT AND TRADEMARK OFFICE
CERTIFICATE OF CORRECTION

PATENT NO. : 5,381,380
DATED : January 10, 1995
INVENTOR(S) : Yukihiro Yoshida

It is certified that error appears in the above-identified patent and that said Letters Patent is hereby corrected as shown below:

Drawings:

Delete Drawing sheet, FIG. 33, and substitute therefor the Drawing sheet FIG. 33, as shown on the attached sheet.

Signed and Sealed this

Thirteenth Day of February, 1996

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,381,380      Page 2 of 4
DATED : January 10, 1995
INVENTOR(S) : Yukihiro Yoshida It is certified that error appears in the above-indentified patent and that said Letters Patent is hereby corrected as shown below:

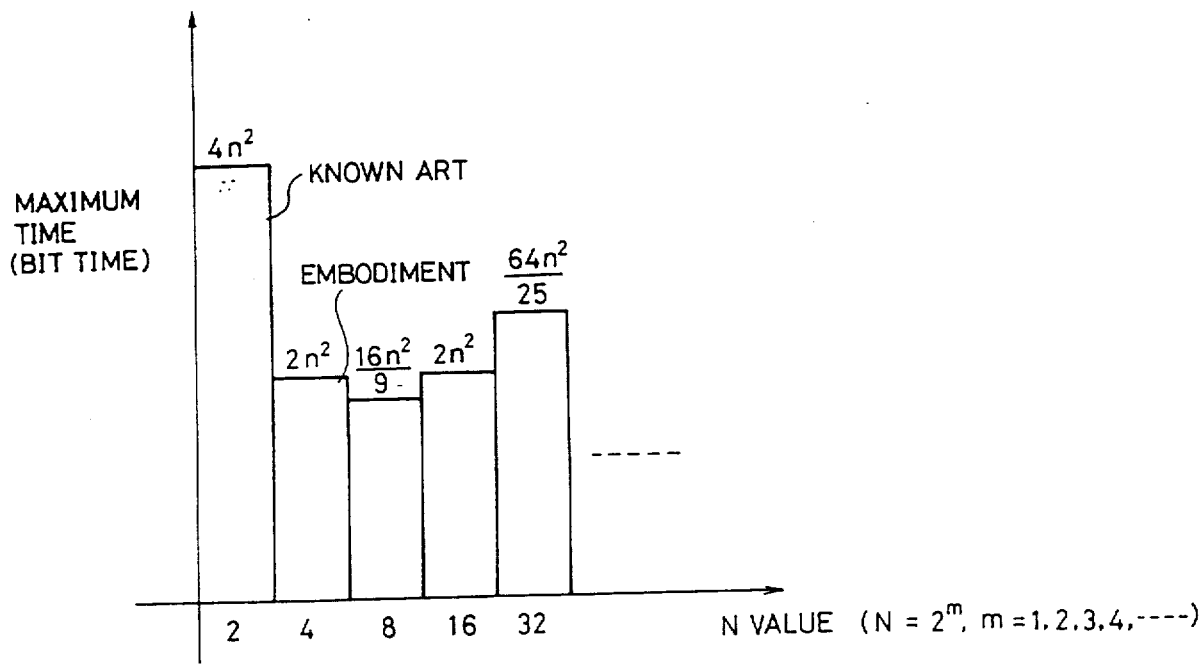

Fig. 33

UNITED STATES PATENT AND TRADEMARK OFFICE
CERTIFICATE OF CORRECTION

PATENT NO. : 5,381,380

DATED : January 10, 1995

INVENTOR(S) : Yukihiro Yoshida

It is certified that error appears in the above-identified patent and that said Letters Patent is hereby corrected as shown below:

Column 7

Line 12, delete "$Y_s = S_s + X_s$" and insert --$Y_s = S_s \oplus X_s$--

Column 8

Chart 2, delete existing chart and insert the following:

|  | $C_0$ | | | | $C_{1/3}$ | | | | $C_{2/3}$ | | | |
|---|---|---|---|---|---|---|---|---|---|---|---|---|
|  | $X_0$ | $X_{1/3}$ | $X_{2/3}$ | $X_1$ | $X_0$ | $X_{1/3}$ | $X_{2/3}$ | $X_1$ | $X_0$ | $X_{1/3}$ | $X_{2/3}$ | $X_1$ |
| $Y_0$ |  |  |  |  | 1 | 1 | 1 | 1 | 2 | 2 | 2 | 2 |
| $Y_{1/3}$ |  | 1 | 2 | 3 | 1 | 2 | 3 |  | 2 | 3 |  | 1 |
| $Y_{2/3}$ |  | 2 |  | 2 | 1 | 3 | 1 | 3 | 2 |  | 2 |  |
| $Y_1$ |  | 3 | 2 | 1 | 1 |  | 3 | 2 | 2 | 1 |  | 3 |

Chart 3, delete existing chart and insert the following:

|  | $C_0$ | | | | $C_{1/3}$ | | | | $C_{2/3}$ | | | |
|---|---|---|---|---|---|---|---|---|---|---|---|---|
|  | $X_0$ | $X_{1/3}$ | $X_{2/3}$ | $X_1$ | $X_0$ | $X_{1/3}$ | $X_{2/3}$ | $X_1$ | $X_0$ | $X_{1/3}$ | $X_{2/3}$ | $X_1$ |
| $Y_0$ |  |  |  |  |  |  |  |  |  |  |  |  |
| $Y_{1/3}$ |  |  |  |  |  |  |  | 1 |  |  | 1 | 1 |
| $Y_{2/3}$ |  |  | 1 | 1 |  |  | 1 | 1 |  | 1 | 1 | 2 |
| $Y_1$ |  |  | 1 | 2 |  | 1 | 1 | 2 |  | 1 | 2 | 2 |

UNITED STATES PATENT AND TRADEMARK OFFICE
CERTIFICATE OF CORRECTION

PATENT NO. : 5,381,380
DATED : January 10, 1995
INVENTOR(S) : Yukihiro Yoshida

It is certified that error appears in the above-indentified patent and that said Letters Patent is hereby corrected as shown below:

Column 9

Delete equation (3) and insert the following:

$$\left. \begin{array}{l} X'_i = \frac{1}{3} \overline{X}_{2i} X_{2i-1} + \frac{2}{3} X_{2i} \overline{X}_{2i-1} + X_{2i} X_{2i-1} \\ Y = \frac{1}{3} \overline{Y}_2 Y_1 + \frac{2}{3} Y_2 \overline{Y}_1 + Y_2 Y_1 \\ C''_{i-1} = \frac{1}{3} \overline{C}_{2i-2} C_{2i-3} + \frac{2}{3} C_{2i-2} \overline{C}_{2i-3} \end{array} \right\} (3)$$

Column 10

Chart 6-1, delete "$C_{i-1}' = 1$" and insert $--\overline{C}'_{i-1} = 1--$

Chart 6-2, delete "$C_{i=1}' = 1$" and insert $--C'_{i-1} = 1--$

Chart 6-3, after "Carry Output" begin a new line $--\overline{C}'_{i-1} = 1--$

Chart 6-4, after "Carry Output" begin a new line $--C'_{i-1} = 1--$